US007144639B2

(12) United States Patent
Nakamura et al.

(10) Patent No.: US 7,144,639 B2
(45) Date of Patent: Dec. 5, 2006

(54) SURFACE-COATED CUTTING TOOL MEMBER HAVING HARD COATING LAYER AND METHOD FOR FORMING THE HARD COATING LAYER ON SURFACE OF CUTTING TOOL

(75) Inventors: Eiji Nakamura, Naka-gun (JP); Hidemitsu Takaoka, Naka-gun (JP); Yasuhiko Tashiro, Tsukuba (JP)

(73) Assignees: Mitsubishi Materials Corporation, Tokyo (JP); Mitsubishi Materials Kobe Tools Corporation, Hyogo-Ken (JP)

( * ) Notice: Subject to any disclaimer, the term of this patent is extended or adjusted under 35 U.S.C. 154(b) by 0 days.

(21) Appl. No.: 10/503,325

(22) PCT Filed: Jan. 30, 2003

(86) PCT No.: PCT/JP03/00903

§ 371 (c)(1),
(2), (4) Date: Jul. 29, 2004

(87) PCT Pub. No.: WO03/064085

PCT Pub. Date: Aug. 7, 2003

(65) Prior Publication Data

US 2005/0089727 A1    Apr. 28, 2005

(30) Foreign Application Priority Data

| Jan. 30, 2002 | (JP) | ............................. 2002-023094 |
| Feb. 5, 2002 | (JP) | ............................. 2002-027896 |
| Mar. 6, 2002 | (JP) | ............................. 2002-060206 |
| Mar. 6, 2002 | (JP) | ............................. 2002-060207 |

(51) Int. Cl.
*B23B 27/14* (2006.01)

(52) U.S. Cl. .................... 428/698; 51/307; 51/309; 407/119; 204/192.38; 428/336; 428/697; 428/699

(58) Field of Classification Search .............. 51/307, 51/309; 407/119; 428/697, 698, 699, 336; 204/192.38
See application file for complete search history.

(56) References Cited

U.S. PATENT DOCUMENTS

| 5,503,912 | A | * | 4/1996 | Setoyama et al. | ........... 428/216 |
| 5,593,234 | A | * | 1/1997 | Liston | .......... 428/698 |
| 5,712,030 | A | * | 1/1998 | Goto et al. | ................. 407/119 |
| 5,783,295 | A | * | 7/1998 | Barnett et al. | ............. 428/698 |
| 6,071,560 | A | * | 6/2000 | Braendle et al. | ....... 204/192.38 |
| 6,274,249 | B1 | * | 8/2001 | Braendle et al. | ............ 428/699 |
| 2005/0129986 | A1 | * | 6/2005 | Sata et al. | ................. 428/698 |

FOREIGN PATENT DOCUMENTS

| DE | 196 09 647 A1 | | 9/1997 |
| EP | 0 833 957 B1 | | 2/2001 |
| FR | 2585730 | * | 2/1985 |
| JP | 05330956 | * | 12/1993 |
| JP | 07-97679 | | 4/1995 |
| JP | 07-205362 | | 8/1995 |
| JP | 08-199338 | * | 8/1996 |
| JP | 09-104965 | | 4/1997 |
| JP | 10-96077 | | 3/1998 |
| JP | 11-61380 | | 3/1999 |
| JP | 11-505573 | | 5/1999 |
| WO | WO-97/34023 A1 | | 9/1997 |

OTHER PUBLICATIONS

Patent Abstracts of Japan for JP10-096077 published on Apr. 14, 1998.
Patent Abstracts of Japan for JP09-104965 published on Apr. 22, 1997.
Patent Abstracts of Japan for JP07-205362 published on Aug. 8, 1995.
Patent Abstracts of Japan for JP11-061380 published on Mar. 5, 1999.
Patent Abstracts of Japan for JP07-097679 published on Apr. 11, 1995.

* cited by examiner

*Primary Examiner*—Archene Turner
(74) *Attorney, Agent, or Firm*—Darby & Darby

(57) ABSTRACT

A surface-coated cutting tool member exhibiting a superior tool life due to a hard coating layer thereof is provided. The surface-coated cutting tool member includes a tungsten carbide based cemented carbide substrate, a titanium carbonitride based cermet substrate, or a cubic boron nitride based sintered substrate; and a hard coating layer of a nitride compound containing titanium and yttrium, which is formed on a surface of the substrate using a physical vapor deposition method in an overall average thickness of 1 to 15 μm. The hard coating layer has a component concentration profile in which maximum Y component containing points (minimum Ti component containing points) and points without Y component (TiN points) appear alternatingly and repeatedly at a predetermined interval in a direction of thickness of the hard coating layer, and the amount of contained Y component is continuously changed from the maximum Y component containing points to the points without Y component and from the points without Y component to the maximum Y component containing points, the maximum Y component containing points satisfy a composition formula of $(Ti_{1-X}Y_X)N$ (where X indicates an atomic ratio of 0.005 to 0.15), and a distance between one of the maximum Y component containing points and adjacent one of the points without Y component is from 0.01 to 0.1 μm.

16 Claims, 5 Drawing Sheets

COATED HARD METAL INSERT

CUTTING EDGE
RAKE FACE
FLANK FACE

CUTTING EDGE

FLUTE

SHANK

SURFACE-COATED CUTTING TOOL MEMBER HAVING HARD COATING LAYER AND METHOD FOR FORMING THE HARD COATING LAYER ON SURFACE OF CUTTING TOOL

CROSS-REFERENCE TO PRIOR APPLICATION

This is a U.S. national phase application under 35 U.S.C. §371 of International Patent Application No. PCT/JP03/00903 filed Jan. 30, 2003, and claims the benefit of Japanese Patent Application Nos. 2002-23094 filed Jan. 31, 2002; 2002-27896 filed Feb. 5, 2002 and 2002-60206 filed Mar. 6, 2002 AND 2002-60207 FILED Mar. 6, 2002 which are incorporated by reference herein. The International Application was published in Japanese on Aug. 7, 2003 as WO 03/064085 A1 under PCT Article 21(2).

TECHNICAL FIELD

The present invention relates to a coated cutting tool exhibiting a superior tool life due to a hard coating layer having superior high temperature properties and strength during a high speed cutting operation for various kinds of steels and cast irons in which a significant amount of heat is generated, or during a cutting operation for various kinds of steels and cast irons under severe cutting conditions, such as with a large depth of cut or a large feed, in which large mechanical impacts occur, and the present invention also relates to a method for forming the above-mentioned hard coating layer on a surface of a cutting tool.

BACKGROUND ART

In general, cutting tools include an indexable insert which is detachably attached to a tip portion of a cutting tool in order to perform a turning or planing operation for a workpiece such as made of various steels or cast irons, a drill or a miniature drill which is used for performing a drilling operation for a workpiece as mentioned above, and a solid type end mill which is used for performing a face milling operation, a groove milling operation, or a shoulder milling operation for a workpiece as mentioned above. In addition, an indexable type end mill is also known, to which an indexable insert is detachably attached for performing a cutting operation as in the case of the solid type end mill.

Moreover, as a coated cutting tool, a coated hard metal tool is known in which a hard coating layer, which has an average thickness of 1 to 15 μm and is made of TiN or a nitride compound (hereinafter termed (Al, Ti)N) layer that includes aluminum and titanium and satisfies a composition formula of $(Al_ZTi_{1-Z})N$ (where Z indicates an atomic ratio of 0.4 to 0.65), is formed, using a physical vapor deposition method, on the surface of a substrate made of a tungsten carbide (hereinafter termed WC) based cemented carbide, a titanium carbonitride (hereinafter termed TiCN) based cermet, or a cubic boron nitride (hereinafter termed c-BN) based sintered material (hereinafter such a substrate is referred to as a hard substrate). It is also well known that such a coated hard metal tool is used in a continuous cutting operation or an interrupted cutting operation for various kinds of steels and cast irons.

Furthermore, it is also known that the above-mentioned coated cutting tool is fabricated through a method in which the above-mentioned hard substrate is accommodated in, for example, an arc ion plating apparatus schematically shown in FIG. 2, which is a type of physical vapor deposition apparatus, an electric current of, for example, 90 A is made to flow as an arc discharge between an anode electrode and a cathode electrode (an evaporation source) to which an Al—Ti alloy having a predetermined composition is attached under the conditions in which the inside of the apparatus is heated to a temperature of, for example, 500° C. using a heater, a nitrogen gas as a reaction gas is introduced into the apparatus so as to prepare a reaction atmosphere at, for example, 2 Pa, and a DC bias voltage of −100 V is applied to the cutting tool, so that a hard coating layer, which is made of an (Al, Ti)N layer is formed on the surface of the above-mentioned hard metal substrate.

On the other hand, in order to improve sliding performance of a hard coating layer, a hard coating layer, as disclosed in, for example, Japanese Unexamined Patent Application, First Publication, No. H05-330956, has been proposed, which is made of a nitride compound layer (hereinafter termed (Ti, R)N) of Ti and a rare-earth element that satisfies a composition formula of $(Ti_{1-Z}R_Z)N$ (where Z is within a range from 0.005 to 0.20, R indicates a rare-earth element such as Dy, Y, La, Nd, or Gd, and Z indicates an atomic ratio of the rare-earth element among the totality of the metal elements) using an ion mixing method.

In recent years, cutting operation apparatuses tend to have significantly high performance, and on the other hand, it is strongly demanded that cutting operations be performed with less power, less energy, and less cost; therefore, cutting operations tend to be performed at high speed. With regard to the above-mentioned conventional coated cutting tool, no significant problem is encountered when such a tool is used under normal cutting conditions; however, when such a tool is used under high speed cutting conditions in which a significant amount of heat is generated, wear of the hard coating layer of the tool is significantly progressed, which leads to a relatively short operation life.

Furthermore, in recent years, cutting operations tend to be performed under severe conditions such as with a large depth of cut or a large feed. With regard to the above-mentioned conventional coated cutting tool, no significant problem is encountered when such a tool is used under normal cutting conditions; however, when such a tool is used in an interrupted cutting operation under severe conditions, such as with a large depth of cut or a large feed, in which large mechanical impacts occur, a cutting edge tends to easily be chipped (small fracturing) due to insufficient strength and toughness of the hard coating layer, which leads to a relatively short operation life.

DISCLOSURE OF INVENTION

In view of the above circumstances, the inventors have conducted research to develop a coated cutting tool exhibiting a superior tool life, in particular, to develop a coated cutting tool whose hard coating layer exhibits a superior chipping resistance during an interrupted and severe cutting operation, by focusing on the above-mentioned hard coating layer of the conventional cutting tools, and have obtained the following research results indicated by (a) to (c).

(a) In the case in which the (Ti, Y)N layer is formed using the above-mentioned arc ion plating apparatus shown in FIG. 2, when a ratio (atomic ratio) of a Y component with respect to the entirety including a Ti component is adjusted so as to be in a range from 0.005 to 0.15, the layer has a significantly superior coating hardness and heat resistance due to coexistence effects of Ti ions and Y ions in the coating layer, and exhibits a significantly superior wear resistance even during a high speed cutting operation in which a significant amount of heat is generated.

(b) The above-mentioned (Ti, Y)N layer has a substantially uniform composition over the entire thickness thereof, and thus has uniform high temperature hardness and heat resistance; however, when a (Ti, Y)N layer is formed on each of the hard substrates using an arc ion plating apparatus whose schematic plan view is shown in FIG. 1A and schematic front view is shown in FIG. 1B, i.e., using an arc ion plating apparatus in which a hard substrate supporting turntable is provided at the center thereof, and a Ti—Y alloy containing Y component as a cathode electrode (an evaporation source) and metallic Ti as another cathode electrode (an evaporation source) are arranged so as to be opposed to each other while having the turntable therebetween, under the conditions in which the hard substrates are mounted in a ring-shape manner along the circumference of the turntable, the atmosphere in the apparatus is made to be a nitrogen atmosphere, the turntable is rotated while each of the hard substrates itself is simultaneously rotated about the axis thereof in order to make a hard coating layer, which is formed by vapor deposition, to have a uniform thickness, and an arc discharge is generated between the two cathode electrodes (the evaporation sources) and an anode electrode, maximum Y component containing points are formed in the (Ti, Y)N layer at moments at which one of the hard substrates, which are disposed on the turntable in a ring-shape manner, is located at a position closest to one of the cathode electrode (the evaporation source) of a Ti—Y alloy and TiN points (points without Y component) are formed in the (Ti, Y)N layer at moments at which one of the hard substrates is located at a position closest to the other cathode electrode of metallic Ti, and the (Ti, Y)N layer exhibits a component concentration profile in which the maximum Y component containing points and the points without Y component appear alternatingly and repeatedly at a predetermined interval in the thickness direction due to the rotation of the turntable, and the amount of contained Y component is continuously changed from the maximum Y component containing points to the points without Y component and from the points without Y component to the maximum Y component containing points.

(c) When the (Ti, Y)N layer having the repeatedly and continuously changing component concentration profile as mentioned in (b) is formed by adjusting the amount of Y component contained in the Ti—Y alloy of one of the opposingly arranged cathode electrodes (the evaporation sources) and the rotational speed of the turntable on which the hard substrates are mounted so that the maximum Y component containing points satisfy a composition formula of $(Ti_{1-X}Y_X)N$ (where X indicates an atomic ratio of 0.005 to 0.10), and a distance between one of the maximum Y component containing points and adjacent one of the points without Y component is from 0.01 to 0.1 μm, the maximum Y component containing points exhibit superior high temperature hardness corresponding to the high temperature hardness of the (Ti, Y)N layer, and on the other hand, the portions near the points without Y component exhibit superior strength and toughness corresponding to those of the TiN since the portions having the points without Y component as the center points thereof include a small amounts of Y component. In addition, because the distance between one of the maximum Y component containing points and adjacent one of the points without Y component is set to be very small, the entire layer exhibits further superior strength and toughness while ensuring high temperature properties. Accordingly, when the coated cutting tool having such a (Ti, Y)N layer as a hard coating layer is used in a cutting operation for various kinds of steels and cast irons under severe cutting conditions, such as with a large depth of cut or a large feed, in which large mechanical impacts occur, the hard coating layer exhibits a superior chipping resistance.

The present invention was conceived in view of the aforementioned research results, and provides a coated cutting tool which includes a hard substrate and a hard coating layer of (Ti, Y)N having an overall average thickness of 1 to 15 μm and formed on the hard substrate by a physical vapor deposition method, and whose hard coating layer exhibits a superior chipping resistance during an interrupted and severe cutting operation.

It is preferable that the hard coating layer have a component concentration profile in which maximum Y component containing points (minimum Ti component containing points) and points without Y component (TiN points) appear alternatingly and repeatedly at a predetermined interval in the thickness direction due to the rotation of the turntable, and the amount of contained Y component be continuously changed from the maximum Y component containing points to the points without Y component and from the points without Y component to the maximum Y component containing points.

Furthermore, it is preferable that the maximum Y component containing points satisfy a composition formula of $(Ti_{1-X}Y_X)N$ (where X indicates an atomic ratio of 0.005 to 0.10), and a distance between one of the maximum Y component containing points and adjacent one of the points without Y component be from 0.01 to 0.1 μm.

A preferable range of X is from 0.005 to 0.10, a more preferable range is from 0.005 to 0.07, and a further preferable range is from 0.01 to 0.05.

The hard substrate may preferably be a substrate of WC based cemented carbide, a substrate of TiCN based cermet, or a substrate of c-BN based sintered material.

The present invention also provides, based on the aforementioned research results, a method for forming a hard coating layer exhibiting a superior chipping resistance during an interrupted and severe cutting operation on a surface of a cutting tool. The method includes: mounting the cutting tool of a hard substrate on a turntable housed in an arc ion plating apparatus at a position radially away from a center axis of the turntable in a manner rotatable about an axis of the cutting tool; producing a nitrogen gas atmosphere as the reaction atmosphere in the arc ion plating apparatus; and generating arc discharge between a cathode electrode of a Ti—Y alloy for forming maximum Y component containing points (minimum Ti component containing points) and an anode electrode, and between another cathode electrode of metallic Ti for forming points without Y component (TiN points), which is disposed so as to oppose to the cathode electrode of a Ti—Y alloy with respect to the turntable, and another anode electrode, so that a hard coating layer of (Ti, Y)N having an overall average thickness of 1 to 15 μm is formed, by a physical vapor deposition method, on the surface of the cutting tool being turned while rotating on the turntable about an axis of the cutting tool, wherein the hard coating layer has a component concentration profile in which the maximum Y component containing points (the minimum Ti component containing points) and the points without Y component (the TiN points) appear alternatingly and repeatedly at a predetermined interval in a direction of thickness of the hard coating layer, and the amount of contained Y component is continuously changed from the maximum Y component containing points to the points without Y component and from the points without Y component to the maximum Y component containing points, the maximum Y component containing points satisfy a composition formula of $(Ti_{1-X}Y_X)N$ (where X indicates an atomic ratio of 0.005 to 0.10), and a distance between one of the maximum Y component containing points and adjacent one of the points without Y component is from 0.01 to 0.1 μm.

A preferable range of X is from 0.005 to 0.10, a more preferable range is from 0.005 to 0.07, and a further preferable range is from 0.01 to 0.05.

The hard substrate may preferably be a substrate of WC based cemented carbide, a substrate of TiCN based cermet, or a substrate of c-BN based sintered material.

Next, the reason the structure of the hard coating layer of the coated cutting tool of the present invention was limited as described above will be explained below.

(A) Composition of the Maximum Y Component Containing Points

The Y component is included in the (Ti, Y)N layer in order to improve high temperature hardness of the TiN layer having superior strength and toughness; therefore, the high temperature properties are improved as the contained Y component is improved; however, when the ratio (atomic ratio: X) of the Y component with respect to a total amount of the Y component and the Ti component is greater than 0.10, even though the TiN points having superior strength and toughness are adjacently disposed, it is difficult to ensure strength and toughness which are required during an interrupted cutting operation under severe cutting conditions, such as with a large depth of cut or a large feed, in which large mechanical impacts occur, and a cutting edge tends to easily be chipped, and on the other hand, when the ratio (atomic ratio: X) is less than 0.005, the high temperature properties are not desirably improved. Accordingly, the ratio was set from 0.005 to 0.10, preferably, from 0.005 to 0.07, and more preferably, from 0.01 to 0.05.

(B) Distance Between the Maximum Y Component Containing Point and the Point without Y Component The distance between the maximum Y component containing point and the point without Y component was set from 0.01 to 0.1 μm because when the distance is less than 0.01 μm, it is difficult to form each of the points so as to have the aforementioned composition, and when the distance is greater than 0.1 μm, weaknesses at each of the points, i.e., insufficient strength and toughness in the case of the maximum Y component containing point, and insufficient high temperature properties in the case of the point without Y component, will locally appear in the layer, which may lead to chipping in the cutting edge or excessive wear.

(C) Overall Average Thickness of the Hard Coating Layer

The average thickness was set from 1 to 15 μm because when the thickness of the layer is less than 1 μm, a desired wear resistance cannot be ensured, and in contrast, when the average thickness is greater than 15 μm, the cutting edge tends to be chipped.

Furthermore, in view of the aforementioned circumstances, the inventors have conducted research to develop a coated cutting tool exhibiting a superior tool life, in particular, to develop a coated cutting tool exhibiting a superior wear resistance during a high speed cutting operation, by focusing on the above-mentioned hard coating layer of the conventional cutting tools, and have obtained the following research results indicated by (b) and (d).

(d) When the (Ti, Y)N layer having the repeatedly and continuously changing component concentration profile as mentioned in (b) is formed by adjusting the amount of Y component contained in the Ti—Y alloy of one of the opposingly arranged cathode electrodes (the evaporation sources) and the rotational speed of the turntable on which the hard substrates are mounted so that the maximum Y component containing points satisfy a composition formula of $(Ti_{1-X}Y_X)N$ (where X indicates an atomic ratio of 0.05 to 0.15), and a distance between one of the maximum Y component containing points and adjacent one of the points without Y component is from 0.01 to 0.1 μm, the maximum Y component containing points exhibit superior high temperature hardness and heat resistance, and on the other hand, the portions near the points without Y component exhibit superior strength and toughness corresponding to those of the TiN since the portions having the points without Y component as the center points thereof include a small amounts of Y component. In addition, because the distance between one of the maximum Y component containing points and adjacent one of the points without Y component is set to be very small, the entire layer exhibits further superior strength and toughness while ensuring high temperature properties. Accordingly, the coated cutting tool having such a (Ti, Y)N layer as a hard coating layer exhibits a further superior wear resistance when used in a high speed cutting operation for various kinds of steels and cast irons in which a significant amount of heat is generated.

The present invention was conceived in view of the aforementioned research results, and provides a coated cutting tool which includes a hard substrate and a hard coating layer of (Ti, Y)N having an overall average thickness of 1 to 15 μm and formed on the hard substrate by a physical vapor deposition method, and whose hard coating layer exhibits a superior wear resistance during a high speed cutting operation.

It is preferable that the hard coating layer have a component concentration profile in which maximum Y component containing points (minimum Ti component containing points) and points without Y component (TiN points) appear alternatingly and repeatedly at a predetermined interval in the thickness direction due to the rotation of the turntable, and the amount of contained Y component be continuously changed from the maximum Y component containing points to the points without Y component and from the points without Y component to the maximum Y component containing points.

Furthermore, it is preferable that the maximum Y component containing points satisfy a composition formula of $(Ti_{1-X}Y_X)N$ (where X indicates an atomic ratio of 0.05 to 0.15), and a distance between one of the maximum Y component containing points and adjacent one of the points without Y component be from 0.01 to 0.1 μm.

The hard substrate may preferably be a substrate of WC based cemented carbide, a substrate of TiCN based cermet, or a substrate of c-BN based sintered material.

The present invention also provides, based on the aforementioned research results, a method for forming a hard coating layer exhibiting a superior wear resistance during a high speed cutting operation on a surface of a cutting tool. The method includes: mounting the cutting tool of a hard substrate on a turntable housed in an arc ion plating apparatus at a position radially away from a center axis of the turntable in a manner rotatable about an axis of the cutting tool; producing a nitrogen gas atmosphere as the reaction atmosphere in the arc ion plating apparatus; and generating arc discharge between a cathode electrode of a Ti—Y alloy for forming maximum Y component containing points (minimum Ti component containing points) and an anode electrode, and between another cathode electrode of metallic Ti for forming points without Y component (TiN points), which is disposed so as to oppose to the cathode electrode of a Ti—Y alloy with respect to the turntable, and another anode electrode, so that a hard coating layer of (Ti, Y)N having an overall average thickness of 1 to 15 μm is formed, by a physical vapor deposition method, on the surface of the cutting tool being turned while rotating on the turntable about an axis of the cutting tool, wherein the hard coating layer has a component concentration profile in which the maximum Y component containing points (the minimum Ti component containing points) and the points without Y component (the TiN points) appear alternatingly and repeatedly at a predetermined interval in a direction of thickness of the hard coating layer, and the amount of contained Y component is continuously changed from the maximum Y component containing points to the points without Y component and from the points without Y component to the maximum Y component containing points, the maximum Y component containing points satisfy a composition formula of $(Ti_{1-X}Y_X)N$ (where X indicates an atomic ratio of 0.05 to 0.15), and a distance between one of the maximum Y component containing points and adjacent one of the points without Y component is from 0.01 to 0.1 μm.

The hard substrate may preferably be a substrate of WC based cemented carbide, a substrate of TiCN based cermet, or a substrate of c-BN based sintered material.

Next, the reason the structure of the hard coating layer of the coated cutting tool of the present invention, and the structure of the hard coating layer formed through the method for forming a hard coating layer of the present invention, were limited as described above will be explained below.

(D) Composition of the Maximum Y Component Containing Points

The Y component is included in the (Ti, Y)N layer in order to improve high temperature hardness and wear resistance of the TiN layer having superior strength and toughness; therefore, the high temperature properties are improved as the contained Y component is improved; however, when the ratio (atomic ratio: X) of the Y component with respect to a total amount of the Y component and the Ti component is greater than 0.15, even though the TiN points having superior strength and toughness are adjacently disposed, the strength and toughness of the overall layer are inevitably reduced, and a cutting edge tends to easily be chipped (small fracturing), and on the other hand, when the ratio (atomic ratio: X) is less than 0.05, the high temperature properties are not desirably improved. Accordingly, the ratio was set from 0.05 to 0.15.

(E) Distance Between the Maximum Y Component Containing Point and the Point without Y Component The distance between the maximum Y component containing point and the point without Y component was set from 0.01 to 0.1 μm because when the distance is less than 0.01 μm, it is difficult to form each of the points so as to have the aforementioned composition, and when the distance is greater than 0.1 μm, weaknesses at each of the points, i.e., insufficient strength and toughness in the case of the maximum Y component containing point, and insufficient high temperature properties in the case of the point without Y component, will locally appear in the layer, which may lead to chipping in the cutting edge or excessive wear.

(F) Overall Average Thickness of the Hard Coating Layer

The average thickness was set from 1 to 15 μm because when the thickness of the layer is less than 1 μm, a desired wear resistance cannot be ensured, and in contrast, when the average thickness is greater than 15 μm, the cutting edge tends to be chipped.

BRIEF DESCRIPTION OF THE DRAWINGS

FIG. 1A is a schematic plan view, and FIG. 1B is a schematic front view.

BEST MODE FOR CARRYING OUT THE INVENTION

Next, the coated cutting tools of the present invention will be explained in detail with Examples.

The following Examples 1 to 3 relate to the coated cutting tools exhibiting a superior tool life, in particular, exhibiting a superior wear resistance.

EXAMPLE 1

Ingredient powders, i.e., powders of WC, TiC, VC, TaC, NbC, $Cr_3C_2$, TiN, TaN, and Co, all of which have an average grain size in a range from 1 to 3 μm, were prepared and mixed in accordance with blending ratios shown in TABLE 1. The ingredient powders were mixed under wet conditions using a ball mill for 72 hours, were dried, and were compacted under pressure of 100 MPa so as to form green compacts. The green compacts were held in a vacuum of 6 Pa at a temperature of 1400° C. for 1 hour so as to be sintered. After sintering, a honing process, in which a radius is set to be 0.04, is applied to cutting edge portions of each of the sintered compacts so as to obtain hard substrates A-1 to A-10 of WC based cemented carbide, each of which had an insert shape defined as CNMG120408 in the ISO standard.

Furthermore, ingredient powders, i.e., powders of TiCN (TiC/TiN=50/50 when expressed by weight ratio), $Mo_2C$, ZrC, NbC, TaC, WC, Co, and Ni, all of which had an average grain size in a range from 0.5 to 2 μm, were prepared and mixed in accordance with blending ratios shown in TABLE 2. The ingredient powders were mixed under wet conditions using a ball mill for 24 hours, were dried, and were compacted under pressure of 100 MPa so as to form green compacts. The green compact were held in a nitrogen atmosphere of 2 kPa, and at a temperature of 1500° C. for 1 hour so as to be sintered. After sintering, a honing process, in which a radius is set to be 0.04, is applied to cutting edge portions of each of the sintered compacts so as to obtain hard substrates B-1 to B-6 of TiCN based cermet, each of which had an insert shape defined as CNMG120408 in the ISO standard.

Figure 1A:
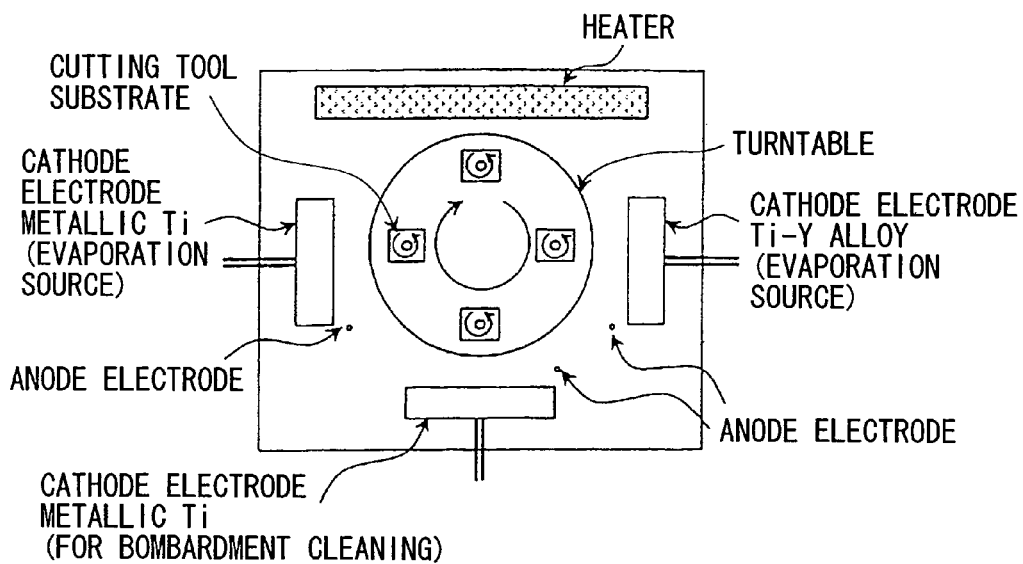
FIGS. 1A and 1B show an arc ion plating apparatus that is used for forming a hard coating layer included in a coated cutting tool of the present invention, in particular.
Figure 1B:
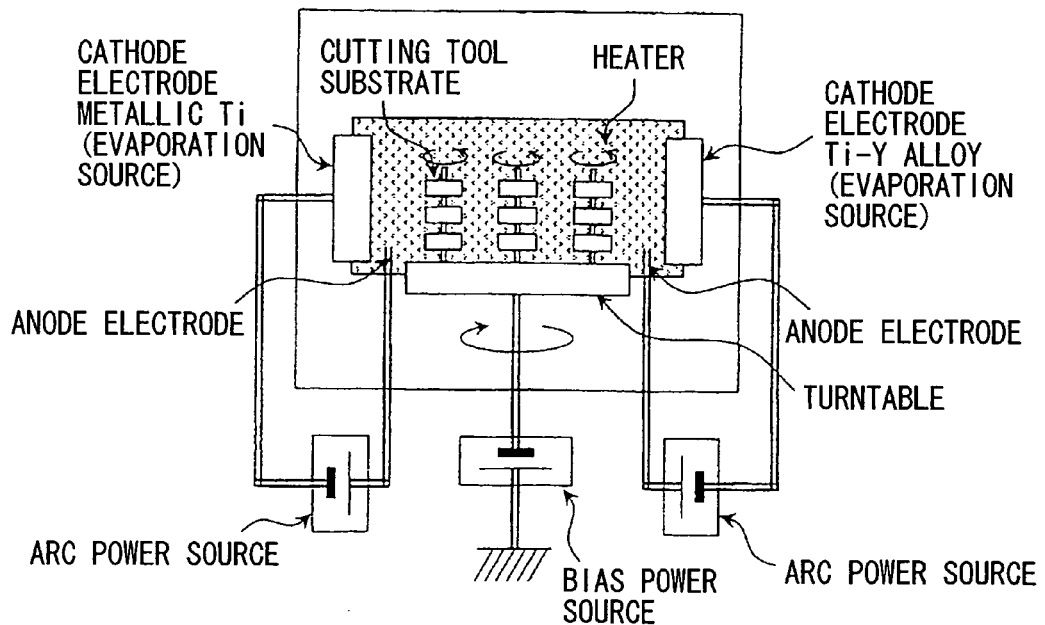
Figure 3A:
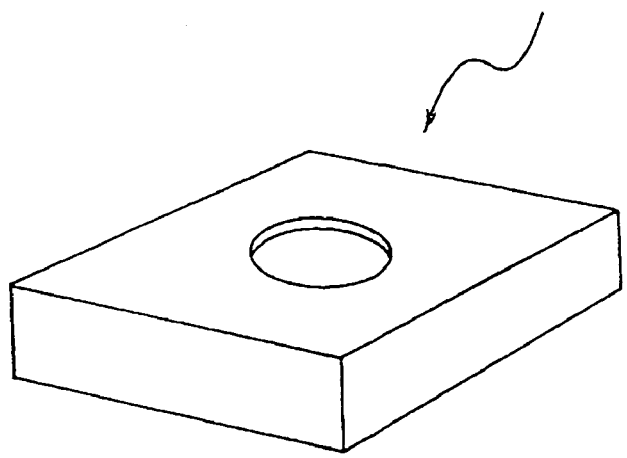
FIG. 3A is a schematic perspective view showing a coated hard metal insert.
Figure 3B:
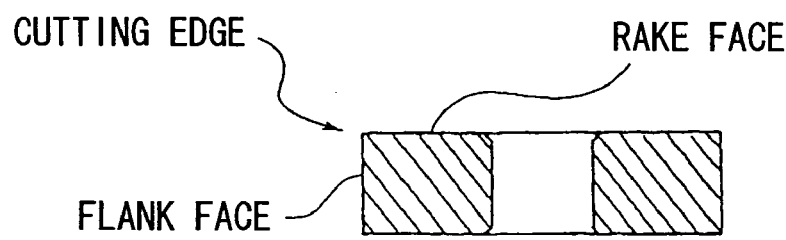
FIG. 3B is a schematic longitudinal cross-sectional view showing the coated hard metal insert.

Next, the aforementioned hard substrates A-1 to A-10 and B-1 to B-6 were subjected to ultrasonic cleaning in acetone, were dried, and were mounted on a turntable housed in an arc ion plating apparatus shown in FIGS. 1A and 1B at positions along the circumference of the turntable. In the arc ion plating apparatus, a Ti—Y alloy having various components for forming maximum Y component containing points was set as a cathode electrode (evaporation source), and metallic Ti for forming points without Y component was set as another cathode electrode (evaporation source) so as to oppose to the cathode electrode of a Ti—Y alloy while having the turntable therebetween. The inside of the apparatus was evacuated and maintained at a vacuum at a pressure of 0.5 Pa, and the inside of the apparatus was heated to a temperature of 350° C. using a heater. Then, a DC bias voltage of −1000 V was applied to the hard substrates which are turned while rotating on the turntable about the respective axes thereof, and an arc discharge was made between the metallic Ti and an anode electrode so that the method of the present invention was carried out by which the surfaces of the hard substrates were subjected to Ti bombardment cleaning. Next, a nitrogen gas, as a reaction gas, was introduced into the apparatus so as to prepare a reaction atmosphere at a pressure of 5.3 Pa, a DC bias voltage of −30 V was applied to the hard substrates which are turned while rotating on the turntable about the respective axes thereof, and an arc discharge was made between the cathode electrodes (the Ti—Y alloy for forming the maximum Y component containing points and the metallic Ti for forming the points without Y component) and the anode electrodes, respectively, so that the method of the present invention was carried out by which a hard coating layer, which had component concentration profile in which the maximum Y component containing points having a designated composition shown in TABLES 3 and 4 and the points without Y component appear alternatingly and repeatedly at a designated interval also shown in TABLES 3 and 4 in the thickness direction, and the amount of contained Y component is continuously changed from the maximum Y component containing points to the points without Y component and from the points without Y component to the maximum Y component containing points, and which had a designated overall layer thickness also shown in TABLES 3 and 4, was formed by a vapor deposition method on the surface of each of the hard substrates, and thereby surface-coated hard metal indexable inserts 1 to 16 of the present invention (hereinafter referred to as coated hard metal inserts of the present invention) having a shape whose schematic perspective view is shown in FIG. 3A, and whose schematic longitudinal cross-sectional view is shown in FIG. 3B, as the coated cutting tools of the present invention, were fabricated.

Figure 2:
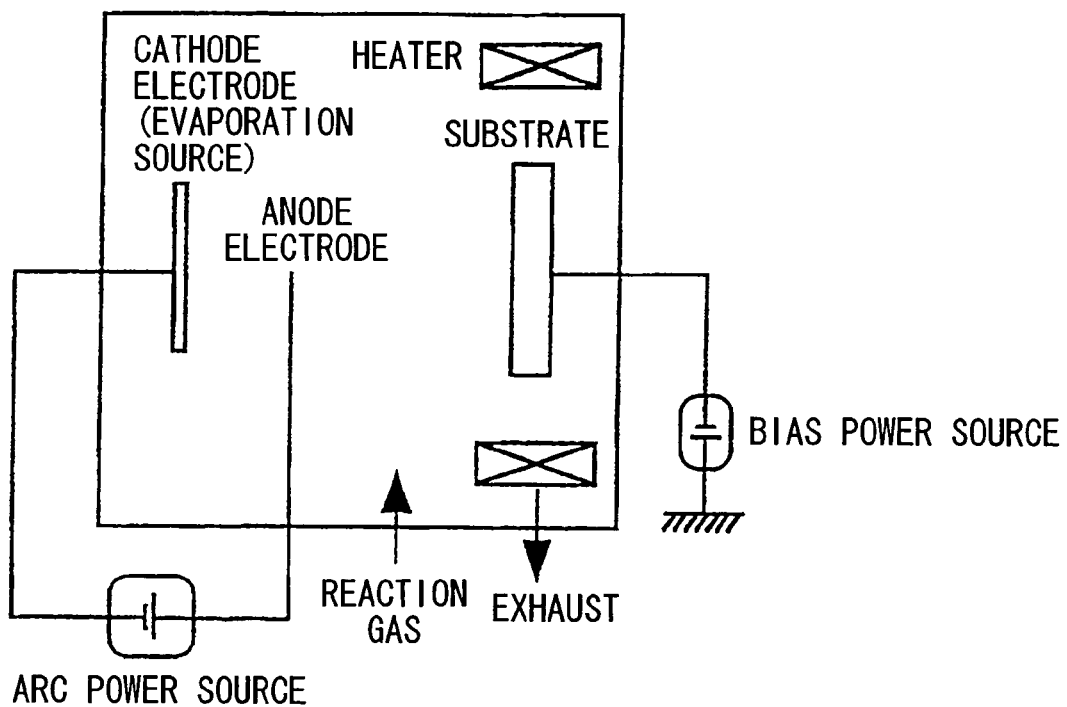
FIG. 2 is a schematic diagram showing a normal arc ion plating apparatus that is used for forming a hard coating layer included in a conventional coated cutting tool.

For the purpose of comparison, the hard substrates A-1 to A-10 and B-1 to B-6 were subjected to ultrasonic cleaning in acetone, were dried, and were accommodated in a conventional arc ion plating apparatus shown in FIG. 2. In the arc ion plating apparatus, a Ti—Y alloy having various components was set as a cathode electrode (evaporation source), the inside of the apparatus was evacuated and maintained at a vacuum at a pressure of 0.5 Pa, the inside of the apparatus was heated to a temperature of 500° C. using a heater, and an argon gas was introduced into the apparatus so as to prepare an argon atmosphere at a pressure of 10 Pa. Then, a DC bias voltage of −800 V was applied to the hard substrates so that the surfaces of the hard substrates were subjected to argon gas bombardment cleaning. Next, a nitrogen gas, as a reaction gas, was introduced into the apparatus so as to prepare a reaction atmosphere at a pressure of 2 Pa, the bias voltage applied to the hard substrates was decreased to −250 V, and an electric current was made to flow as an arc discharge between the cathode electrode and the anode electrode so that a conventional method was carried out by which a hard coating layer, which had a designated composition and a designated layer thickness shown in TABLES 5 and 6, and which included a (Ti, Y)N layer in which composition was substantially constant in the direction of the layer thickness, was formed by a vapor deposition method on the surface of each of the hard substrates A-1 to A-10 and B-1 to B-6, and thereby conventional surface-coated hard metal indexable inserts 1 to 16 (hereinafter referred to as conventional coated hard metal inserts) also having a shape shown in FIGS. 3A and 3B, as conventional coated cutting tools, were fabricated.

Next, the coated hard metal inserts 1 to 16 of the present invention and the conventional coated hard metal inserts 1 to 16 were subjected to cutting tests by attaching each of them to a tip portion of a cutting tool made of tool steel using a fixing bridge and a screw. The detailed test conditions were set as follows:

with regard to high-speed, dry, and continuous turning tests in which workpieces of alloy steel were machined,
workpiece: a circular bar of SCM440 defined in the JIS,
cutting speed: 285 m/min,
depth of cut: 1.5 mm,
feed: 0.3 mm/rev,
time: 5 min;
with regard to high-speed, dry, and interrupted turning tests in which workpieces of carbon steel were machined,
workpiece: a circular bar with four evenly distributed longitudinal grooves made of S45C defined in the JIS,
cutting speed: 315 m/min,
depth of cut: 2 mm,
feed: 0.25 mm/rev,
time: 5 min; and
with regard to high-speed, dry, and interrupted turning tests in which workpieces of cast iron were machined,
workpiece: a circular bar with four evenly distributed longitudinal grooves made of FC300 defined in the JIS,
cutting speed: 355 m/min,
depth of cut: 2 mm,
feed: 0.25 mm/rev,
time: 5 min.

In each of the turning tests, flank wear width of the cutting edge was measured. The test results are shown in TABLES 3 to 6.

TABLE 1

| Classification | | Blending ratio (wt %) | | | | | |
|---|---|---|---|---|---|---|---|
| | | Co | TiC | TaC | NbC | VC | $Cr_3C_2$ | WC |
| Hard substrate (Insert) | A-1 | 5.5 | — | 1 | — | — | — | Balance |
| | A-2 | 6 | — | — | — | — | 0.5 | Balance |
| | A-3 | 6.5 | — | — | — | 0.5 | 0.5 | Balance |
| | A-4 | 7 | 0.4 | — | 1.5 | — | — | Balance |
| | A-5 | 8 | — | — | 2 | — | — | Balance |
| | A-6 | 8.5 | 8 | 9 | 1 | — | — | Balance |
| | A-7 | 8.5 | 6 | — | 5 | — | — | Balance |
| | A-8 | 10 | 10 | — | 5 | — | 0.5 | Balance |
| | A-9 | 12 | — | — | — | — | 0.8 | Balance |
| | A-10 | 12.5 | 1.5 | — | — | 0.5 | 0.5 | Balance |

TABLE 2

| Classification | | Blending ratio (wt %) | | | | | | | |
|---|---|---|---|---|---|---|---|---|---|
| | | Co | Ni | ZrC | TaC | NbC | $MO_2C$ | WC | TiCN |
| Hard substrate (Insert) | B-1 | 12.5 | 5 | — | 10 | — | 10 | 16 | Balance |
| | B-2 | 8.5 | 7 | — | 5 | — | 7.5 | — | Balance |
| | B-3 | 6 | — | — | — | 2 | 6 | 10 | Balance |
| | B-4 | 10 | 5 | — | — | 8 | — | — | Balance |
| | B-5 | 9 | 4 | 1 | — | 5 | 10 | 10 | Balance |
| | B-6 | 12 | 5.5 | — | — | 6 | 9.5 | 14.5 | Balance |

TABLE 3

| | | Symbols of hard substrate | Hard coating layer | | | | | | | Flank wear width (mm) | | |
|---|---|---|---|---|---|---|---|---|---|---|---|---|
| | | | Maximum Y component containing points | | | | | Designated distance between two points (μm) | Designated overall layer thickness (μm) | Continuous high speed cutting of alloy steel | Interrupted high speed cutting of carbon steel | Interrupted high speed cutting of cast iron |
| Classification | | | Designated composition (atomic ratio) | | | Points without Y component | | | | | | |
| | | | Ti | Y | N | | | | | | | |
| Coated | 1 | A-1 | 0.950 | 0.050 | 1.00 | TiN | | 0.01 | 3 | 0.25 | 0.20 | 0.19 |
| hard metal | 2 | A-2 | 0.925 | 0.075 | 1.00 | TiN | | 0.01 | 15 | 0.12 | 0.10 | 0.08 |
| insert | 3 | A-3 | 0.910 | 0.090 | 1.00 | TiN | | 0.03 | 5 | 0.21 | 0.20 | 0.18 |
| of the | 4 | A-4 | 0.895 | 0.105 | 1.00 | TiN | | 0.04 | 13 | 0.14 | 0.12 | 0.09 |
| present | 5 | A-5 | 0.880 | 0.120 | 1.00 | TiN | | 0.02 | 8 | 0.17 | 0.17 | 0.13 |
| invention | 6 | A-6 | 0.860 | 0.140 | 1.00 | TiN | | 0.05 | 11 | 0.16 | 0.15 | 0.11 |
| | 7 | A-7 | 0.850 | 0.150 | 1.00 | TiN | | 0.06 | 6 | 0.21 | 0.19 | 0.16 |
| | 8 | A-8 | 0.945 | 0.055 | 1.00 | TiN | | 0.07 | 9 | 0.15 | 0.13 | 0.12 |
| | 9 | A-9 | 0.940 | 0.060 | 1.00 | TiN | | 0.10 | 4 | 0.22 | 0.21 | 0.18 |
| | 10 | A-10 | 0.935 | 0.065 | 1.00 | TiN | | 0.08 | 7 | 0.19 | 0.18 | 0.13 |

TABLE 4

| | | Symbols of hard substrate | Hard coating layer | | | | | | | Flank wear width (mm) | | |
|---|---|---|---|---|---|---|---|---|---|---|---|---|
| | | | Maximum Y component containing points | | | | | Designated distance between two points (μm) | Designated overall layer thickness (μm) | Continuous high speed cutting of alloy steel | Interrupted high speed cutting of carbon steel | Interrupted high speed cutting of cast iron |
| Classification | | | Designated composition (atomic ratio) | | | Points without Y component | | | | | | |
| | | | Ti | Y | N | | | | | | | |
| Coated | 11 | B-1 | 0.950 | 0.050 | 1.00 | TiN | | 0.01 | 5 | 0.22 | 0.20 | 0.19 |
| hard metal | 12 | B-2 | 0.930 | 0.070 | 1.00 | TiN | | 0.02 | 7 | 0.20 | 0.19 | 0.15 |
| insert | 13 | B-3 | 0.910 | 0.090 | 1.00 | TiN | | 0.04 | 9 | 0.16 | 0.15 | 0.12 |
| of the | 14 | B-4 | 0.890 | 0.110 | 1.00 | TiN | | 0.05 | 11 | 0.15 | 0.15 | 0.11 |
| present | 15 | B-5 | 0.870 | 0.130 | 1.00 | TiN | | 0.07 | 13 | 0.14 | 0.13 | 0.10 |
| invention | 16 | B-6 | 0.850 | 0.150 | 1.00 | TiN | | 0.10 | 15 | 0.12 | 0.12 | 0.09 |

TABLE 5

| | | Symbols of hard substrate | Hard coating layer | | | | Flank wear width (mm) | | |
|---|---|---|---|---|---|---|---|---|---|
| | | | Designated composition (atomic ratio) | | | Designated layer thickness (μm) | Continuous high speed cutting of alloy steel | Interrupted high speed cutting of carbon steel | Interrupted high speed cutting of cast iron |
| Classification | | | Ti | Y | N | | | | |
| Conventional | 1 | A-1 | 0.995 | 0.005 | 1.00 | 3 | 0.68 | 0.58 | 0.53 |
| coated hard | 2 | A-2 | 0.975 | 0.025 | 1.00 | 15 | 0.55 | 0.48 | 0.45 |
| metal insert | 3 | A-3 | 0.970 | 0.030 | 1.00 | 5 | 0.66 | 0.56 | 0.51 |
| | 4 | A-4 | 0.965 | 0.035 | 1.00 | 13 | 0.57 | 0.48 | 0.46 |
| | 5 | A-5 | 0.980 | 0.020 | 1.00 | 8 | 0.61 | 0.53 | 0.49 |
| | 6 | A-6 | 0.970 | 0.030 | 1.00 | 11 | 0.58 | 0.49 | 0.48 |
| | 7 | A-7 | 0.960 | 0.040 | 1.00 | 6 | 0.65 | 0.56 | 0.50 |
| | 8 | A-8 | 0.990 | 0.010 | 1.00 | 9 | 0.60 | 0.52 | 0.48 |
| | 9 | A-9 | 0.985 | 0.015 | 1.00 | 4 | 0.68 | 0.58 | 0.53 |
| | 10 | A-10 | 0.980 | 0.020 | 1.00 | 7 | 0.63 | 0.55 | 0.49 |

TABLE 6

| | | | Hard coating layer | | | Flank wear width (mm) | | |
|---|---|---|---|---|---|---|---|---|
| | | Symbols of hard | Designated composition (atomic ratio) | | | Designated layer thickness | Continuous high speed cutting of | Interrupted high speed cutting of | Interrupted high speed cutting of |
| Classification | | substrate | Ti | Y | N | (μm) | alloy steel | carbon steel | cast iron |
| Conventional | 11 | B-1 | 0.995 | 0.005 | 1.00 | 5 | 0.65 | 0.56 | 0.54 |
| coated hard | 12 | B-2 | 0.985 | 0.015 | 1.00 | 7 | 0.64 | 0.54 | 0.52 |
| metal insert | 13 | B-3 | 0.980 | 0.020 | 1.00 | 9 | 0.60 | 0.52 | 0.51 |
| | 14 | B-4 | 0.975 | 0.025 | 1.00 | 11 | 0.58 | 0.51 | 0.49 |
| | 15 | B-5 | 0.970 | 0.030 | 1.00 | 13 | 0.56 | 0.50 | 0.48 |
| | 16 | B-6 | 0.960 | 0.400 | 1.00 | 15 | 0.55 | 0.50 | 0.48 |

EXAMPLE 2

Ingredient powders, i.e., medium coarse powder of WC having an average grain size of 5.5 μm, fine powder of WC having an average grain size of 0.8 μm, powder of TaC having an average grain size of 1.3 μm, powder of NbC having an average grain size of 1.2 μm, powder of ZrC having an average grain size of 1.2 μm, powder of $Cr_3C_2$ having an average grain size of 2.3 μm, powder of VC having an average grain size of 1.5 μm, powder of (Ti, W)C having an average grain size of 1.0 μm, and powder of Co having an average grain size of 1.8 μm, were prepared. The ingredient powders were blended according to the blending ratios shown in TABLE 7, were mixed in acetone after adding wax for 24 hours using a ball mill, were subjected to depressurized drying, and were compacted under a pressure of 100 MPa so as to obtain various green compacts having predetermined shapes. The green compacts were held in a vacuum of 6 Pa while increasing temperature from 1370° C. to 1470° C. at a temperature increasing rate of 7° C./min, were further held at this temperature for 1 hour, and were cooled in the oven so as to be sintered and so as to obtain sintered circular bars for forming three types of hard substrates, each type having one of diameters of 8 mm, 13 mm, and 26 mm. The three types of hard substrates were subjected to grinding so as to obtain hard substrates (end mill) C-1 to C-8, each of which has cutting edges dimensionally defined by one of combinations of diameter and length (diameter×length), i.e., one of 6 mm×13 mm, 10 mm×22 mm, and 20 mm×45 mm, as shown in TABLE 7.

Figure 4A:
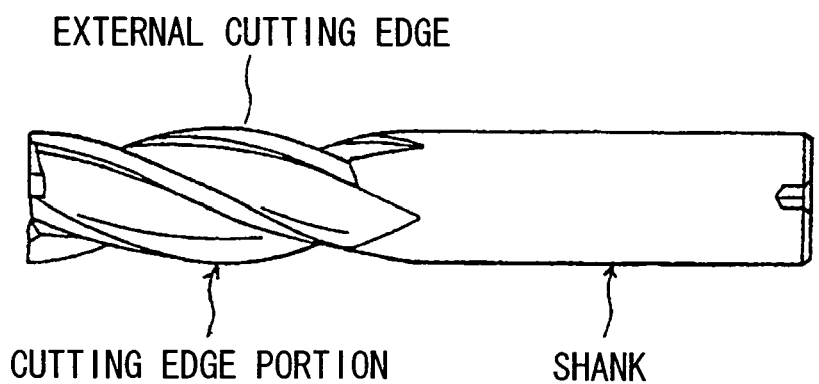
FIG. 4A is a schematic front view showing a coated hard metal end mill.
Figure 4B:
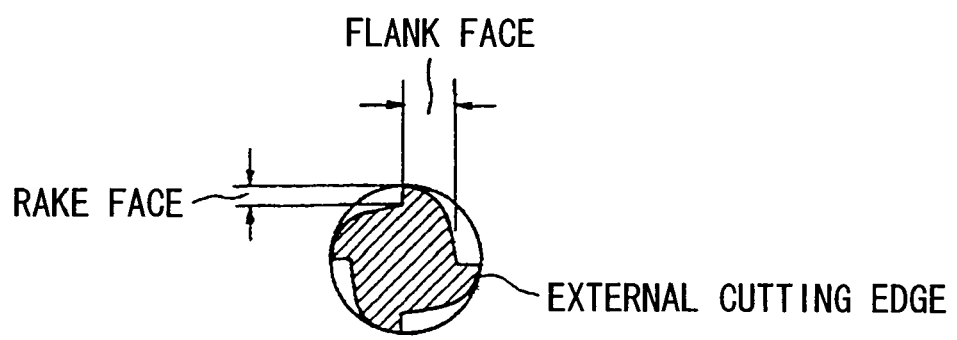
FIG. 4B is a schematic transverse cross-sectional view showing cutting edges of the end mill.

Next, the surfaces of the hard substrates (end mill) C-1 to C-8 were subjected to a honing process and ultrasonic cleaning in acetone, and then the hard substrates C-1 to C-8 were dried, and were accommodated in the arc ion plating apparatus shown in FIGS. 1A and 1B, and then the method of the present invention was carried out under the same conditions as in Example 1 by which a hard coating layer, which had component concentration profile in which the maximum Y component containing points having a designated composition shown in TABLE 8 and the points without Y component appear alternatingly and repeatedly at a designated interval also shown in TABLE 8 in the thickness direction, and the amount of contained Y component is continuously changed from the maximum Y component containing points to the points without Y component and from the points without Y component to the maximum Y component containing points, and which had a designated overall layer thickness also shown in TABLE 8, was formed by a vapor deposition method, and thereby surface-coated hard metal end mills 1 to 8 of the present invention (hereinafter referred to as coated hard metal end mills of the present invention) having a shape whose schematic front view is shown in FIG. 4A, and whose schematic transverse cross-sectional view, specifically at the cutting edge, is shown in FIG. 4B, as the coated cutting tools of the present invention, were fabricated.

For the purpose of comparison, the surfaces of the hard substrates (end mills) C-1 to C-8 were subjected to a honing process and ultrasonic cleaning in acetone, and then the hard substrates C-1 to C-8 were dried, and were accommodated in a conventional arc ion plating apparatus shown in FIG. 2. The conventional method was carried out under the same conditions as in the Example 1 by which a hard coating layer, which had a designated composition and a designated layer thickness shown in TABLE 9, and which included a (Ti, Y)N layer in which composition was substantially constant in the direction of the layer thickness, was formed by a vapor deposition method, and thereby conventional surface-coated hard metal end mills 1 to 8 (hereinafter referred to as conventional coated hard metal end mills), as conventional coated cutting tools, were fabricated.

Next, among the coated hard metal end mills 1 to 8 of the present invention and the conventional coated hard metal end mills 1 to 8, the coated hard metal end mills 1 to 3 of the present invention and the conventional coated hard metal end mills 1 to 3 were subjected to lubricated, high-speed, and groove formation cutting tests in which workpieces of tool steel were machined under the following conditions, workpiece: a plate of SKD61 (hardness: HRC53) defined in the JIS having a plane size of 100 mm×25 mm, and a thickness of 50 mm,
cutting speed: 60 m/mm,
depth of groove (depth of cut): 0.2 mm, and
table feed: 120 mm/min.

The coated hard metal end mills 4 to 6 of the present invention and the conventional coated hard metal end mills 4 to 6 were subjected to lubricated, high-speed, and groove formation cutting tests in which workpieces of stainless steel were machined under the following conditions, workpiece: a plate of SUS304 defined in the JIS having a plane size of 100 mm×250 mm, and a thickness of 50 mm,
cutting speed: 75 m/min, depth of groove (depth of cut): 3 mm, and
table feed: 230 mm/min.

The coated hard metal end mills 7 and 8 of the present invention and the conventional coated hard metal end mills 7 and 8 were subjected to lubricated, high-speed, and groove formation cutting tests in which workpieces of alloy steel were machined under the following conditions,
workpiece: a plate of SCM439 defined in the JIS having a plane size of 100 mm×250 mm, and a thickness of 50 mm,
cutting speed: 170 m/min,
depth of groove (depth of cut): 6 mm, and
table feed: 240 mm/min.

In each of the groove formation cutting tests (in which a water-miscible cutting fluid was used), a groove was formed until reduction in the diameter of the cutting edge reached 0.15 mm, which indicates that the tool life has ended, and the length of cut groove was measured. The test results are shown in TABLES 8 and 9.

TABLE 7

| Classification | | Co | (Ti,W)C | TaC | NbC | ZrC | $Cr_3C_2$ | VC | WC | Diameter × length of cutting edge (mm) |
|---|---|---|---|---|---|---|---|---|---|---|
| Hard substrate (end mill) | C-1 | 6 | — | — | — | — | — | — | Fine grain: Balance | 6 × 13 |
| | C-2 | 6 | — | 1 | 0.5 | — | — | — | Fine grain: Balance | 6 × 13 |
| | C-3 | 6 | — | 1 | — | 1 | 0.5 | 0.5 | Fine grain: Balance | 6 × 13 |
| | C-4 | 8 | — | — | — | — | 0.5 | 0.5 | Fine grain: Balance | 10 × 22 |
| | C-5 | 9 | 9 | 9 | 1 | — | — | — | Medium coarse grain: Balance | 10 × 22 |
| | C-6 | 9 | 8 | — | 8 | — | — | — | Medium coarse grain: Balance | 10 × 22 |
| | C-7 | 12 | 17 | — | 5 | — | — | — | Medium coarse grain: Balance | 20 × 45 |
| | C-8 | 14 | — | — | 11 | 10 | — | — | Medium coarse grain: Balance | 20 × 45 |

TABLE 8

| Classification | | Symbols of hard substrate | Maximum Ti component containing points Designated composition (atomic ratio) | | | Points without Y component | Designated distance between two points (μm) | Designated overall layer thickness (μm) | Length of cut groove (m) |
|---|---|---|---|---|---|---|---|---|---|
| | | | Ti | Y | N | | | | |
| Coated hard metal end mill of the present invention | 1 | C-1 | 0.950 | 0.050 | 1.00 | TiN | 0.01 | 2 | 105 |
| | 2 | C-2 | 0.935 | 0.065 | 1.00 | TiN | 0.02 | 2 | 124 |
| | 3 | C-3 | 0.920 | 0.080 | 1.00 | TiN | 0.04 | 1 | 88 |
| | 4 | C-4 | 0.905 | 0.095 | 1.00 | TiN | 0.03 | 3 | 57 |
| | 5 | C-5 | 0.895 | 0.105 | 1.00 | TiN | 0.05 | 4 | 69 |
| | 6 | C-6 | 0.880 | 0.120 | 1.00 | TiN | 0.06 | 5 | 78 |
| | 7 | C-7 | 0.865 | 0.135 | 1.00 | TiN | 0.08 | 2.5 | 163 |
| | 8 | C-8 | 0.850 | 0.150 | 1.00 | TiN | 0.1 | 3.5 | 185 |

TABLE 9

| Classification | | Symbols of hard substrate | Designated composition (atomic ratio) | | | Designated layer thickness (μm) | Length of cut groove (m) |
|---|---|---|---|---|---|---|---|
| | | | Ti | Y | N | | |
| Conventional coated hard metal end mill | 1 | C-1 | 0.995 | 0.005 | 1.00 | 2 | 28 |
| | 2 | C-2 | 0.990 | 0.010 | 1.00 | 2 | 32 |
| | 3 | C-3 | 0.985 | 0.015 | 1.00 | 1 | 23 |
| | 4 | C-4 | 0.980 | 0.020 | 1.00 | 3 | 14 |
| | 5 | C-5 | 0.975 | 0.025 | 1.00 | 4 | 17 |
| | 6 | C-6 | 0.970 | 0.030 | 1.00 | 5 | 21 |
| | 7 | C-7 | 0.965 | 0.035 | 1.00 | 2.5 | 45 |
| | 8 | C-8 | 0.960 | 0.040 | 1.00 | 3.5 | 49 |

EXAMPLE 3

The three types of sintered bars, i.e., the bars having a diameter of 8 mm (for forming hard substrates C-1 to C-3), the bars having a diameter of 13 mm (for forming hard substrates C-4 to C-6), and the bars having a diameter of 26 mm (for forming hard substrates C-7 and C-8), fabricated in Example 2 were subjected to grinding so as to obtain hard substrates (drills) D-1 to D-8, and more specifically, to obtain hard substrates D-1 to D-3 having a fluted portion size of 4 mm×13 mm (diameter×length), hard substrates D-4 to D-6 having a fluted portion size of 8 mm×22 mm, and hard substrates D-7 and D-8 having a fluted portion size of 16 mm×45 mm.

Figure 5A:
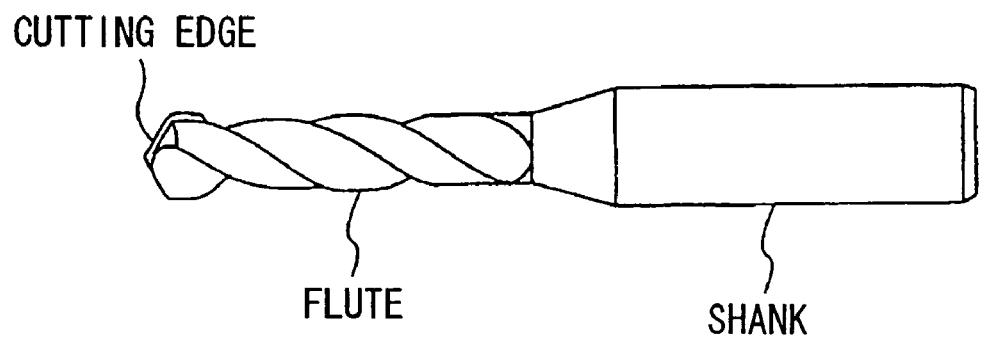
FIG. 5A is a schematic front view showing a coated hard metal drill.
Figure 5B:
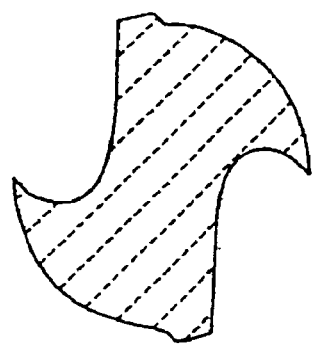
FIG. 5B is a schematic transverse cross-sectional view showing the flute of the drill.

Next, honing processes were applied to the surfaces of the hard substrates (drills) D-1 to D-8, the hard substrates D-1 to D-8 were subjected to ultrasonic cleaning in acetone, were dried, and were accommodated in the arc ion plating apparatus shown in FIGS. 1A and 1B, and then the method of the present invention was carried out under the same conditions as in Example 1 by which a hard coating layer, which had component concentration profile in which the maximum Y component containing points having a designated composition shown in TABLE 10 and the points without Y component appear alternatingly and repeatedly at a designated interval also shown in TABLE 10 in the thickness direction, and the amount of contained Y component is continuously changed from the maximum Y component containing points to the points without Y component and from the points without Y component to the maximum Y component containing points, and which had a designated overall layer thickness also shown in TABLE 10, was formed by a vapor deposition method, and thereby surface-coated hard metal drills 1 to 8 of the present invention (hereinafter referred to as coated hard metal drills of the present invention) having a shape whose schematic front view is shown in FIG. 5A, and whose schematic transverse cross-sectional view, specifically at the fluted portion, is shown in FIG. 5B, as the coated cutting tools of the present invention, were fabricated.

For the purpose of comparison, honing processes were applied to the surfaces of the hard substrates (drills) D-1 to D-8, the hard substrates D-1 to D-8 were subjected to ultrasonic cleaning in acetone, and then the hard substrates D-1 to D-8 were dried, and were accommodated in a conventional arc ion plating apparatus shown in FIG. 2. The conventional method was carried out under the same conditions as in the Example 1 by which a hard coating layer, which had a designated composition and a designated layer thickness shown in TABLE 11, and which included a (Ti, Y)N layer in which composition was substantially constant in the direction of the layer thickness, was formed by a vapor deposition method, and thereby conventional surface-coated hard metal drills 1 to 8 (hereinafter referred to as conventional coated hard metal drills), as conventional coated cutting tools, were fabricated.

Next, among the coated hard metal drills 1 to 8 of the present invention and the conventional coated hard metal drills 1 to 8, the coated hard metal drills 1 to 3 of the present inventin and the conventional coated hard metal drills 1 to 3 were subjected to lubricated and high-speed drilling tests in which workpieces of tool steel were machined under the following conditions, workpiece: a plate of SKD61 (hardness: HRC53) defined in the JIS having a plane size of 100 mm×250 mm, and a thickness of 50 mm, cutting speed: 50 m/min, and feed: 0.2 mm/rev.

The coated hard metal drills 4 to 6 of the present invention and the conventional coated hard metal drills 4 to 6 were subjected to lubricated and high-speed drilling tests in which workpieces of ductile cast iron were machined under the following conditions, workpiece: a plate of FCD450 defined in the JIS having a plane size of 100 mm×250 mm, and a thickness of 50 mm, cutting speed: 120 m/min, and feed: 0.35 mm/rev.

The coated hard metal drills 7 and 8 of the present invention and the conventional coated hard metal drills 7 and 8 were subjected to lubricated and high-speed drilling tests in which workpieces of cast iron were machined under the following conditions, workpiece: a plate of FC300 defined in the JIS having a plane size of 100 mm×250 mm, and a thickness of 50 mm, cutting speed: 150 m/min, and feed: 0.45 mm/rev.

In each of the lubricated and high-speed drilling tests (in which a water-miscible cutting fluid was used), holes were formed until flank wear width of the cutting edge of the tip portion reached 0.3 mm, and the number of the holes was counted. The test results are shown in TABLES 10 and 11.

TABLE 10

| | | | | Hard coating layer | | | | |
|---|---|---|---|---|---|---|---|---|
| | | | Maximum Y component containing points Designated composition (atomic ratio) | | | Points without Y component | Designated distance between two points (μm) | Designated overall layer thickness (μm) | Number of drilled holes |
| Classification | | Symbols of hard substrate | Ti | Y | N | | | | |
| Coated hard metal drill of the present invention | 1 | D-1 | 0.950 | 0.050 | 1.00 | TiN | 0.01 | 5 | 468 |
| | 2 | D-2 | 0.935 | 0.065 | 1.00 | TiN | 0.01 | 3 | 422 |
| | 3 | D-3 | 0.920 | 0.080 | 1.00 | TiN | 0.03 | 7 | 505 |
| | 4 | D-4 | 0.905 | 0.095 | 1.00 | TiN | 0.06 | 3 | 1172 |
| | 5 | D-5 | 0.895 | 0.105 | 1.00 | TiN | 0.10 | 4 | 1340 |
| | 6 | D-6 | 0.880 | 0.120 | 1.00 | TiN | 0.05 | 2 | 1096 |
| | 7 | D-7 | 0.865 | 0.135 | 1.00 | TiN | 0.08 | 2.5 | 2042 |
| | 8 | D-8 | 0.850 | 0.150 | 1.00 | TiN | 0.04 | 3.5 | 2156 |

TABLE 11

| Classification | | Symbols of hard substrate | Hard coating layer | | | Designated layer thickness (μm) | Number of drilled holes |
|---|---|---|---|---|---|---|---|
| | | | Designated composition (atomic ratio) | | | | |
| | | | Ti | Y | N | | |
| Conventional coated hard metal drill | 1 | D-1 | 0.995 | 0.005 | 1.00 | 5 | 123 |
| | 2 | D-2 | 0.990 | 0.010 | 1.00 | 3 | 105 |
| | 3 | D-3 | 0.985 | 0.015 | 1.00 | 7 | 138 |
| | 4 | D-4 | 0.980 | 0.020 | 1.00 | 3 | 304 |
| | 5 | D-5 | 0.975 | 0.025 | 1.00 | 4 | 433 |
| | 6 | D-6 | 0.970 | 0.030 | 1.00 | 2 | 285 |
| | 7 | D-7 | 0.965 | 0.035 | 1.00 | 2.5 | 499 |
| | 8 | D-8 | 0.960 | 0.040 | 1.00 | 3.5 | 592 |

The compositions of the maximum Y component containing points and the points without Y component of the hard coating layers which were included in the coated cutting tools of the present invention, i.e., in the coated hard metal inserts 1 to 16 of the present invention, in the coated hard metal end mills 1 to 8 of the present invention, and in the coated hard metal drills 1 to 8 of the present invention, and the compositions of the hard coating layers which were included in the conventional coated cutting tools, i.e., in the conventional coated hard metal inserts 1 to 16, in the conventional coated hard metal end mills 1 to 8, in the conventional coated hard metal drills 1 to 8, were measured using an Auger spectroscopic analyzer, and it was confirmed that the compositions were substantially the same as the designated compositions, respectively.

In addition, the distances between the maximum Y component containing points and the points without Y component, and the overall thicknesses of the hard coating layers of the coated cutting tools of the present invention, and the thicknesses of the hard coating layers of conventional coated cutting tools were measured using a scanning electron microscope, and it was confirmed that the distances and thicknesses were substantially the same as the designated ones, respectively.

According to the results shown in TABLES 3 to 11, it is apparent that the coated cutting tools of the present invention, which include the hard coating layer having a component concentration profile in which the maximum Y component containing points and the points without Y component appear alternatingly and repeatedly at a predetermined interval in a direction of thickness of the hard coating layer, and the amount of contained Y component is continuously changed from the maximum Y component containing points to the points without Y component and from the points without Y component to the maximum Y component containing points, exhibit a superior wear resistance during a high speed cutting operation for steels and cast irons in which a significant amount of heat is generated since the hard coating layer exhibits further superior high temperature properties (high temperature hardness and wear resistance) due to the maximum Y component containing points, and exhibits superior strength and toughness due to the points without Y component which are substantially made of TiN, and in contrast, the conventional coated cutting tools, in which the hard coating layer is of the (Ti, Y)N layer containing less Y component when compared with the maximum Y component containing points, in which composition is substantially constant in the direction of the layer thickness, exhibit excessive wear of the cutting edge and relatively short tool life due to insufficient high temperature properties during high speed cutting operations under high temperature conditions.

As explained above, because the coated cutting tools of the present invention exhibit a superior wear resistance during a high speed cutting operation for various kinds of steels and cast irons, and exhibit a superior cutting performance for a long term, the coated cutting tools of the present invention can sufficiently meet the demand of high performance of the cutting operation apparatus, and demands of less power, less energy, and lower cost in cutting operations.

Next, the coated cutting tools of the present invention will be explained with further Examples.

The following Examples 4 to 6 relate to the coated cutting tools exhibiting a superior tool life, in particular, exhibiting a superior chipping resistance.

EXAMPLE 4

Ingredient powders, i.e., powders of WC, TiC, VC, TaC, NbC, $Cr_3C_2$, TiN, TaN, and Co, all of which have an average grain size in a range from 1 to 3 μm, were prepared and mixed in accordance with blending ratios shown in TABLE 12. The ingredient powders were mixed under wet conditions using a ball mill for 72 hours, were dried, and were compacted under pressure of 100 MPa so as to form green compacts. The green compacts were held in a vacuum of 6 Pa at a temperature of 1400° C. for 1 hour so as to be sintered. After sintering, a honing process, in which a radius is set to be 0.04, is applied to cutting edge portions of each of the sintered compacts so as to obtain hard substrates A-1 to A-10 of WC based hard metal, each of which had an insert shape defined as CNMG120412 in the ISO standard.

Furthermore, ingredient powders, i.e., powders of TiCN (TiC/TiN=50/50 when expressed by weight ratio), $Mo_2C$, ZrC, NbC, TaC, WC, Co, and Ni, all of which had an average grain size in a range from 0.5 to 2 μm, were prepared and mixed in accordance with blending ratios shown in TABLE 13. The ingredient powders were mixed under wet conditions using a ball mill for 24 hours, were dried, and were compacted under pressure of 100 MPa so as to form green compacts. The green compact were held in a nitrogen atmosphere of 2 kPa, and at a temperature of 1500° C. for 1 hour so as to be sintered. After sintering, a honing process, in which a radius is set to be 0.04, is applied to cutting edge portions of each of the sintered compacts so as to obtain hard substrates B-1 to B-6 of TiCN based cermet, each of which had an insert shape defined as CNMG120408 in the ISO standard.

Next, the aforementioned hard substrates A-1 to A-10 and B-1 to B-6 were subjected to ultrasonic cleaning in acetone, were dried, and were mounted on a turntable housed in an arc ion plating apparatus shown in FIGS. 1A and 1B at positions along the circumference of the turntable. In the arc ion plating apparatus, a Ti—Y alloy having various components for forming maximum Y component containing points was set as a cathode electrode (evaporation source), and metallic Ti for forming points without Y component was set as another cathode electrode (evaporation source) so as to oppose to the cathode electrode of a Ti—Y alloy while having the turntable therebetween. The inside of the apparatus was evacuated and maintained at a vacuum at a pressure of 0.5 Pa, and the inside of the apparatus was heated to a temperature of 350° C. using a heater. Then, a DC bias voltage of −1000 V was applied to the hard substrates which are turned while rotating on the turntable about the respective axes thereof, and an arc discharge was made between the metallic Ti and an anode electrode so that the method of the present invention was carried out by which the surfaces of the hard substrates were subjected to Ti bombardment cleaning. Next, a nitrogen gas, as a reaction gas, was introduced into the apparatus so as to prepare a reaction atmosphere at a pressure of 5.3 Pa, a DC bias voltage of −30 V was applied to the hard substrates which are turned while rotating on the turntable about the respective axes thereof, and an arc discharge was made between the cathode electrodes (the Ti—Y alloy for forming the maximum Y component containing points and the metallic Ti for forming the points without Y component) and the anode electrodes, respectively, so that the method of the present invention was carried out by which a hard coating layer, which had component concentration profile in which the maximum Y component containing points having a designated composition shown in TABLES 14 and 15 and the points without Y component appear alternatingly and repeatedly at a designated interval also shown in TABLES 14 and 15 in the thickness direction, and the amount of contained Y component is continuously changed from the maximum Y component containing points to the points without Y component and from the points without Y component to the maximum Y component containing points, and which had a designated overall layer thickness also shown in TABLES 14 and 15, was formed, by a vapor deposition method, on the surface of each of the hard substrates, and thereby surface-coated hard metal indexable inserts 1 to 20 of the present invention (hereinafter referred to as coated hard metal inserts of the present invention) having a shape whose schematic perspective view is shown in FIG. 3A, and whose schematic longitudinal cross-sectional view is shown in FIG. 3B, as the coated cutting tools of the present invention, were fabricated.

For the purpose of comparison, the hard substrates A-1 to A-10 and B-1 to B-6 were subjected to ultrasonic cleaning in acetone, were dried, and were accommodated in a conventional arc ion plating apparatus shown in FIG. 2. In the arc ion plating apparatus, a Ti—Y alloy having various components was set as a cathode electrode (evaporation source), the inside of the apparatus was evacuated and maintained at a vacuum at a pressure of 0.5 Pa, the inside of the apparatus was heated to a temperature of 500° C. using a heater, and an argon gas was introduced into the apparatus so as to prepare an argon atmosphere at a pressure of 10 Pa. Then, a DC bias voltage of −800 V was applied to the hard substrates so that the surfaces of the hard substrates were subjected to argon gas bombardment cleaning. Next, a nitrogen gas, as a reaction gas, was introduced into the apparatus so as to prepare a reaction atmosphere at a pressure of 2 Pa, the bias voltage applied to the hard substrates was decreased to −250 V, and an electric current was made to flow as an arc discharge between the cathode electrode and the anode electrode so that a conventional method was carried out by which a hard coating layer, which had a designated composition and a designated layer thickness shown in TABLES 16 and 17, and which included a (Ti, Y)N layer in which composition was substantially constant in the direction of the layer thickness, was formed, by a vapor deposition method, on the surface of each of the hard substrates A-1 to A-10 and B-1 to B-6, and thereby conventional surface-coated hard metal indexable inserts 1 to 20 (hereinafter referred to as conventional coated hard metal inserts) also having a shape shown in FIGS. 3A and 3B, as conventional coated cutting tools, were fabricated.

Next, the coated hard metal inserts 1 to 20 of the present invention and the conventional coated hard metal inserts 1 to 20 were subjected to cutting tests by attaching each of them to a tip portion of a cutting tool made of tool steel using a fixing bridge and a screw. The detailed test conditions were set as follows:

with regard to dry and interrupted cutting tests with a large depth of cut in which workpieces of alloy steel were machined, workpiece: a circular bar with four evenly distributed longitudinal grooves made of SCM440 defined in the JIS, cutting speed: 150 m/min, depth of cut: 6.8 mm, feed: 0.2 mm/rev, time: 7 min;

with regard to dry and interrupted cutting tests with a large feed in which workpieces of carbon steel were machined, workpiece: a circular bar with four evenly distributed longitudinal grooves made of S45C defined in the JIS, cutting speed: 150 m/min, depth of cut: 1.5 mm, feed: 0.7 mm/rev, time: 7 min; and with regard to dry and interrupted cutting tests with a large depth of cut in which workpieces of cast iron were machined, workpiece: a circular bar with four evenly distributed longitudinal grooves made of FC300 defined in the JIS, cutting speed: 180 m/min, depth of cut: 7 mm, feed: 0.2 mm/rev, time: 7 min.

In each of the turning tests, flank wear width of the cutting edge was measured. The test results are shown in TABLES 14 to 17.

TABLE 12

| Classification | | Blending ratio (wt %) | | | | | | |
|---|---|---|---|---|---|---|---|---|
| | | Co | TiC | TaC | NbC | VC | $Cr_3C_2$ | WC |
| Hard substrate (Insert) | A-1 | 6 | — | 1 | — | — | — | Balance |
| | A-2 | 6.5 | — | — | — | — | 0.5 | Balance |
| | A-3 | 7 | — | — | — | 0.5 | 0.5 | Balance |
| | A-4 | 7.5 | 0.4 | — | 1.5 | — | — | Balance |
| | A-5 | 8.5 | — | — | 2 | — | — | Balance |
| | A-6 | 9 | 8 | 9 | 1 | — | — | Balance |
| | A-7 | 9 | 6 | — | 5 | — | — | Balance |
| | A-8 | 10.5 | 10 | — | 5 | — | 0.5 | Balance |
| | A-9 | 12.5 | — | — | — | — | 0.8 | Balance |
| | A-10 | 13 | 1.5 | — | — | 0.5 | 0.5 | Balance |

TABLE 13

| Classification | | Blending ratio (wt %) | | | | | | | |
|---|---|---|---|---|---|---|---|---|---|
| | | Co | Ni | ZrC | TaC | NbC | MO₂C | WC | TiCN |
| Hard substrate (Insert) | B-1 | 13 | 5 | — | 10 | — | 10 | 16 | Balance |
| | B-2 | 9 | 7 | — | 5 | — | 7.5 | — | Balance |
| | B-3 | 6.5 | — | — | — | 2 | 6 | 10 | Balance |
| | B-4 | 10 | 5.5 | — | — | 8 | — | — | Balance |
| | B-5 | 9 | 4.5 | 1 | — | 5 | 10 | 10 | Balance |
| | B-6 | 12 | 6 | — | — | 6 | 9.5 | 14.5 | Balance |

TABLE 14

| Classification | | Symbols of hard substrate | Hard coating layer | | | | | | Flank wear width (mm) | | |
|---|---|---|---|---|---|---|---|---|---|---|---|
| | | | Maximum Y component containing points Designated composition (atomic ratio) | | | Points without Y component | Designated distance between two points (μm) | Designated overall layer thickness (μm) | Interrupted cutting of alloy steel with large depth of cut | Interrupted cutting of carbon steel with large feed | Interrupted cutting of cast iron with large depth of cut |
| | | | Ti | Y | N | | | | | | |
| Coated hard metal insert of the present invention | 1 | A-1 | 0.995 | 0.005 | 1.00 | TiN | 0.10 | 15 | 0.20 | 0.18 | 0.15 |
| | 2 | A-2 | 0.985 | 0.015 | 1.00 | TiN | 0.03 | 10 | 0.16 | 0.15 | 0.13 |
| | 3 | A-3 | 0.975 | 0.025 | 1.00 | TiN | 0.06 | 7 | 0.17 | 0.15 | 0.15 |
| | 4 | A-4 | 0.965 | 0.035 | 1.00 | TiN | 0.02 | 3 | 0.22 | 0.22 | 0.21 |
| | 5 | A-5 | 0.955 | 0.045 | 1.00 | TiN | 0.01 | 5 | 0.21 | 0.18 | 0.16 |
| | 6 | A-6 | 0.990 | 0.010 | 1.00 | TiN | 0.05 | 1 | 0.29 | 0.27 | 0.25 |
| | 7 | A-7 | 0.980 | 0.020 | 1.00 | TiN | 0.04 | 6 | 0.20 | 0.19 | 0.15 |
| | 8 | A-8 | 0.970 | 0.030 | 1.00 | TiN | 0.06 | 8 | 0.18 | 0.16 | 0.10 |
| | 9 | A-9 | 0.960 | 0.040 | 1.00 | TiN | 0.01 | 12 | 0.14 | 0.12 | 0.08 |
| | 10 | A-10 | 0.975 | 0.025 | 1.00 | TiN | 0.08 | 9 | 0.17 | 0.14 | 0.12 |
| | 11 | A-1 | 0.950 | 0.050 | 1.00 | TiN | 0.01 | 3 | 0.21 | 0.25 | 0.18 |
| | 12 | A-2 | 0.925 | 0.075 | 1.00 | TiN | 0.01 | 15 | 0.25 | 0.24 | 0.18 |
| | 13 | A-3 | 0.910 | 0.090 | 1.00 | TiN | 0.03 | 5 | 0.24 | 0.22 | 0.19 |
| | 14 | A-4 | 0.900 | 0.100 | 1.00 | TiN | 0.04 | 10 | 0.29 | 0.26 | 0.18 |

TABLE 15

| Classification | | Symbols of hard substrate | Hard coating layer | | | | | | Flank wear width (mm) | | |
|---|---|---|---|---|---|---|---|---|---|---|---|
| | | | Maximum Y component containing points Designated composition (atomic ratio) | | | Points without Y component | Designated distance between two points (μm) | Designated overall layer thickness (μm) | Interrupted cutting of alloy steel with large depth of cut | Interrupted cutting of carbon steel with large feed | Interrupted cutting of cast iron with large depth of cut |
| | | | Ti | Y | N | | | | | | |
| Coated hard metal insert of the present invention | 15 | B-1 | 0.955 | 0.045 | 1.00 | TiN | 0.01 | 15 | 0.12 | 0.11 | 0.08 |
| | 16 | B-2 | 0.990 | 0.010 | 1.00 | TiN | 0.03 | 11 | 0.19 | 0.19 | 0.17 |
| | 17 | B-3 | 0.965 | 0.035 | 1.00 | TiN | 0.07 | 5 | 0.22 | 0.22 | 0.19 |
| | 18 | B-4 | 0.995 | 0.005 | 1.00 | TiN | 0.02 | 13 | 0.19 | 0.19 | 0.16 |
| | 19 | B-5 | 0.980 | 0.020 | 1.00 | TiN | 0.05 | 7 | 0.16 | 0.16 | 0.12 |
| | 20 | B-6 | 0.970 | 0.030 | 1.00 | TiN | 0.10 | 9 | 0.15 | 0.15 | 0.10 |

TABLE 16

| Classification | | Symbols of hard substrate | Hard coating layer | | | | Flank wear width (mm) | | |
|---|---|---|---|---|---|---|---|---|---|
| | | | Designated composition (atomic ratio) | | | Designated layer thickness (μm) | Continuous high speed cutting of alloy steel | Interrupted high speed cutting of carbon steel | Interrupted high speed cutting of cast iron |
| | | | Ti | Y | N | | | | |
| Conventional coated hard metal insert | 1 | A-1 | 0.995 | 0.005 | 1.00 | 15 | Tool Life Ended in 2.8 minutes | Tool Life Ended in 3.0 minutes | Tool Life Ended in 4.1 minutes |
| | 2 | A-2 | 0.985 | 0.015 | 1.00 | 10 | in 3.2 minutes | in 3.3 minutes | in 4.4 minutes |
| | 3 | A-3 | 0.975 | 0.025 | 1.00 | 7 | in 3.6 minutes | in 3.5 minutes | in 4.9 minutes |
| | 4 | A-4 | 0.965 | 0.035 | 1.00 | 3 | in 4.2 minutes | in 4.5 minutes | in 6.2 minutes |
| | 5 | A-5 | 0.955 | 0.045 | 1.00 | 5 | in 3.7 minutes | in 4.0 minutes | in 5.5 minutes |

TABLE 16-continued

| | | Hard coating layer | | | | Flank wear width (mm) | | |
|---|---|---|---|---|---|---|---|---|
| | | Designated composition (atomic ratio) | | | Designated layer thickness | Continuous high speed cutting of | Interrupted high speed cutting of | Interrupted high speed cutting of |
| Classification | Symbols of hard substrate | Ti | Y | N | (μm) | alloy steel | carbon steel | cast iron |
| 6 | A-6 | 0.990 | 0.010 | 1.00 | 1 | in 3.2 minutes | in 3.5 minutes | in 5.8 minutes |
| 7 | A-7 | 0.980 | 0.020 | 1.00 | 6 | in 3.5 minutes | in 3.9 minutes | in 5.1 minutes |
| 8 | A-8 | 0.970 | 0.030 | 1.00 | 8 | in 3.3 minutes | in 3.6 minutes | in 4.7 minutes |
| 9 | A-9 | 0.960 | 0.040 | 1.00 | 12 | in 3.0 minutes | in 3.3 minutes | in 4.4 minutes |
| 10 | A-10 | 0.975 | 0.025 | 1.00 | 9 | in 3.3 minutes | in 3.5 minutes | in 4.6 minutes |
| 11 | A-1 | 0.950 | 0.050 | 1.00 | 3 | in 2.7 minutes | in 3.8 minutes | in 4.4 minutes |
| 12 | A-2 | 0.925 | 0.075 | 1.00 | 15 | in 2.5 minutes | in 3.6 minutes | in 4.2 minutes |
| 13 | A-3 | 0.910 | 0.090 | 1.00 | 5 | in 2.9 minutes | in 3.4 minutes | in 6.0 minutes |
| 14 | A-4 | 0.900 | 0.100 | 1.00 | 10 | in 2.8 minutes | in 3.7 minutes | in 4.5 minutes |

(in the TABLE, tool life ended due to chipping)

TABLE 17

| | | Hard coating layer | | | | Flank wear width (mm) | | |
|---|---|---|---|---|---|---|---|---|
| | | Designated composition (atomic ratio) | | | Designated layer thickness | Continuous high speed cutting of | Interrupted high speed cutting of | Interrupted high speed cutting of |
| Classification | Symbols of hard substrate | Ti | Y | N | (μm) | alloy steel | carbon steel | cast iron |
| Conventional coated hard metal insert | 15 B-1 | 0.955 | 0.045 | 1.00 | 15 | Tool Life Ended in 2.4 minutes | Tool Life Ended in 2.5 minutes | Tool Life Ended in 3.9 minutes |
| | 16 B-2 | 0.990 | 0.010 | 1.00 | 11 | in 3.6 minutes | in 3.8 minutes | in 4.7 minutes |
| | 17 B-3 | 0.965 | 0.035 | 1.00 | 5 | in 4.0 minutes | in 4.1 minutes | in 5.5 minutes |
| | 18 B-4 | 0.995 | 0.005 | 1.00 | 13 | in 3.8 minutes | in 4.0 minutes | in 5.3 minutes |
| | 19 B-5 | 0.980 | 0.020 | 1.00 | 7 | in 3.6 minutes | in 3.6 minutes | in 4.5 minutes |
| | 20 B-6 | 0.970 | 0.030 | 1.00 | 9 | in 3.4 minutes | in 3.5 minutes | in 4.8 minutes |

(in the TABLE, tool life ended due to chipping)

EXAMPLE 5

Ingredient powders, i.e., medium coarse powder of WC having an average grain size of 5.5 μm, fine powder of WC having an average grain size of 0.8 μm, powder of TaC having an average grain size of 1.3 μm, powder of NbC having an average grain size of 1.2 μm, powder of ZrC having an average grain size of 1.2 μm, powder of $Cr_3C_2$ having an average grain size of 2.3 μm, powder of VC having an average grain size of 1.5 μm, powder of (Ti, W)C having an average grain size of 1.0 μm, and powder of Co having an average grain size of 1.8 μm, were prepared. The ingredient powders were blended according to the blending ratios shown in TABLE 18, were mixed in acetone after adding wax for 24 hours using a ball mill, were subjected to depressurized drying, and were compacted under a pressure of 100 MPa so as to obtain various green compacts having predetermined shapes. The green compacts were held in a vacuum of 6 Pa while increasing temperature from 1370° C. to 1470° C. at a temperature increasing rate of 7° C./min, were further held at this temperature for 1 hour, and were cooled in the oven so as to be sintered and so as to obtain sintered circular bars for forming three types of hard substrates, each type having one of diameters of 8 mm, 13 mm, and 26 mm. The three types of hard substrates were subjected to grinding so as to obtain hard substrates (end mill) C-1 to C-8, each of which has cutting edges dimensionally defined by one of combinations of diameter and length (diameter×length), i.e., one of 6 mm×13 mm, 10 mm×22 mm, and 20 mm×45 mm, as shown in TABLE 18.

Next, the surfaces of the hard substrates (end mill) C-1 to C-8 were subjected to a honing process and ultrasonic cleaning in acetone, and then the hard substrates C-1 to C-8 were dried, and were accommodated in the arc ion plating apparatus shown in FIGS. 1A and 1B, and then the method of the present invention was carried out under the same conditions as in Example 4 by which a hard coating layer, which had component concentration profile in which the maximum Y component containing points having a designated composition shown in TABLE 19 and the points without Y component appear alternatingly and repeatedly at a designated interval also shown in TABLE 19 in the thickness direction, and the amount of contained Y component is continuously changed from the maximum Y component containing points to the points without Y component and from the points without Y component to the maximum Y component containing points, and which had a designated overall layer thickness also shown in TABLE 19, was formed by a vapor deposition method, and thereby surface-coated hard metal end mills 1 to 10 of the present invention (hereinafter referred to as coated hard metal end mills of the present invention) having a shape whose schematic front view is shown in FIG. 4A, and whose schematic transverse cross-sectional view, specifically at the cutting edge, is shown in FIG. 4B, as the coated cutting tools of the present invention, were fabricated.

For the purpose of comparison, the surfaces of the hard substrates (end mills) C-1 to C-8 were subjected to a honing process and ultrasonic cleaning in acetone, and then the hard substrates C-1 to C-8 were dried, and were accommodated in a conventional arc ion plating apparatus shown in FIG. 2. The conventional method was carried out under the same conditions as in the Example 4 by which a hard coating layer, which had a designated composition and a designated layer thickness shown in TABLE 20, and which included a (Ti, Y)N layer in which composition was substantially constant in the direction of the layer thickness, was formed by a vapor deposition method, and thereby conventional surface-coated hard metal end mills 1 to 10 (hereinafter referred to as conventional coated hard metal end mills), as conventional coated cutting tools, were fabricated.

Next, among the coated hard metal end mills 1 to 10 of the present invention and the conventional coated hard metal end mills 1 to 10, the coated hard metal end mills 1, 2, 3, 9, and 10 of the present invention and the conventional coated hard metal end mills 1, 2, 3, 9, and 10 were subjected to lubricated and groove formation cutting tests with a large depth of cut in which workpieces of tool steel were machined under the following conditions, workpiece: a plate of SKD11 defined in the JIS having a plane size of 100 mm×250 mm, and a thickness of 50 mm,
cutting speed: 20 m/min,
depth of groove (depth of cut): 1.5 mm, and
table feed: 50 mm/min.

The coated hard metal end mills 4 to 6 of the present invention and the conventional coated hard metal end mills 4 to 6 were subjected to lubricated and groove formation cutting tests with a large depth of cut in which workpieces of stainless steel were machined under the following conditions, workpiece: a plate of SUS304 defined in the JIS having a plane size of 100 mm×250 mm, and a thickness of 50 mm,
cutting speed: 50 m/min,
depth of groove (depth of cut): 10 mm, and
table feed: 290 mm/min.

The coated hard metal end mills 7 and 8 of the present invention and the conventional coated hard metal end mills 7 and 8 were subjected to lubricated and groove formation cutting tests with a large feed in which workpieces of alloy steel were machined under the following conditions, workpiece: a plate of SNCM439 defined in the JIS having a plane size of 100 mm×250 mm, and a thickness of 50 mm,
cutting speed: 60 m/min,
depth of groove (depth of cut): 5 mm, and
table feed: 450 nm/min.

In each of the groove formation cutting tests (in which a water-miscible cutting fluid was used), a groove was formed until reduction in the diameter of the cutting edge reached 0.2 mm, which indicates that the tool life has ended, and the length of cut groove was measured. The test results are shown in TABLES 19 and 20.

TABLE 18

| Classification | | Co | (Ti,W)C | TaC | NbC | ZrC | $Cr_3C_2$ | VC | WC | Diameter × length of cutting edge (mm) |
|---|---|---|---|---|---|---|---|---|---|---|
| Hard substrate (end mill) | C-1 | 6 | — | — | 0.5 | — | — | — | Fine grain: Balance | 6 × 13 |
| | C-2 | 8 | — | 1 | 0.5 | — | — | — | Fine grain: Balance | 6 × 13 |
| | C-3 | 10 | — | 1 | — | 1 | 0.5 | 0.5 | Fine grain: Balance | 6 × 13 |
| | C-4 | 6 | — | — | — | — | 0.5 | 0.5 | Fine grain: Balance | 10 × 22 |
| | C-5 | 10 | 9 | 9 | 1 | — | — | — | Medium coarse grain: Balance | 10 × 22 |
| | C-6 | 12 | 8 | — | 8 | — | — | — | Medium coarse grain: Balance | 10 × 22 |
| | C-7 | 16 | 17 | — | 5 | — | — | — | Medium coarse grain: Balance | 20 × 45 |
| | C-8 | 10 | — | — | — | — | 0.7 | — | Fine grain: Balance | 20 × 45 |

TABLE 19

| Classification | | Symbols of hard substrate | Maximum Ti component containing points Designated composition (atomic ratio) | | | Points without Y component | Designated distance between two points (μm) | Designated overall layer thickness (μm) | Length of cut groove (m) |
|---|---|---|---|---|---|---|---|---|---|
| | | | Ti | Y | N | | | | |
| Coated hard metal end mill of the present invention | 1 | C-1 | 0.995 | 0.005 | 1.00 | TiN | 0.10 | 3.5 | 48 |
| | 2 | C-2 | 0.985 | 0.015 | 1.00 | TiN | 0.08 | 2 | 39 |
| | 3 | C-3 | 0.975 | 0.025 | 1.00 | TiN | 0.01 | 2.5 | 42 |
| | 4 | C-4 | 0.990 | 0.010 | 1.00 | TiN | 0.04 | 2 | 56 |
| | 5 | C-5 | 0.980 | 0.020 | 1.00 | TiN | 0.02 | 2 | 58 |
| | 6 | C-6 | 0.965 | 0.035 | 1.00 | TiN | 0.10 | 1 | 43 |
| | 7 | C-7 | 0.970 | 0.030 | 1.00 | TiN | 0.03 | 1.5 | 92 |
| | 8 | C-8 | 0.955 | 0.045 | 1.00 | TiN | 0.06 | 2.5 | 116 |

TABLE 19-continued

| Classification | | Symbols of hard substrate | Hard coating layer | | | | | | |
|---|---|---|---|---|---|---|---|---|---|
| | | | Maximum Ti component containing points Designated composition (atomic ratio) | | | Points without | Designated distance between two points | Designated overall layer thickness | Length of cut |
| | | | Ti | Y | N | Y component | (μm) | (μm) | groove (m) |
| | 9 | C-1 | 0.935 | 0.065 | 1.00 | TiN | 0.02 | 2 | 38 |
| | 10 | C-2 | 0.905 | 0.095 | 1.00 | TiN | 0.03 | 3 | 23 |

TABLE 20

| Classification | | Symbols of hard substrate | Hard coating layer | | | | |
|---|---|---|---|---|---|---|---|
| | | | Designated composition (atomic ratio) | | | Designated layer thickness (μm) | Length of cut groove (m) |
| | | | Ti | Y | N | | |
| Conventional coated hard metal end mill | 1 | C-1 | 0.995 | 0.005 | 1.00 | 3.5 | Tool Life Ended at 10 m |
| | 2 | C-2 | 0.985 | 0.015 | 1.00 | 2 | at 8 m |
| | 3 | C-3 | 0.975 | 0.025 | 1.00 | 2.5 | at 9 m |
| | 4 | C-4 | 0.990 | 0.010 | 1.00 | 2 | at 12 m |
| | 5 | C-5 | 0.980 | 0.020 | 1.00 | 2 | at 13 m |
| | 6 | C-6 | 0.965 | 0.035 | 1.00 | 1 | at 10 m |
| | 7 | C-7 | 0.970 | 0.030 | 1.00 | 1.5 | at 21 m |
| | 8 | C-8 | 0.955 | 0.045 | 1.00 | 2.5 | at 27 m |
| | 9 | C-1 | 0.935 | 0.065 | 1.00 | 2 | at 9 m |
| | 10 | C-2 | 0.905 | 0.905 | 1.00 | 3 | at 6 m |

EXAMPLE 6

The three types of sintered bars, i.e., the bars having a diameter of 8 mm (for forming hard substrates C-1 to C-3), the bars having a diameter of 13 mm (for forming hard substrates C-4 to C-6), and the bars having a diameter of 26 mm (for forming hard substrates C-7 and C-8), fabricated in Example 5 were subjected to grinding so as to obtain hard substrates (drills) D-1 to D-8, and more specifically, to obtain hard substrates D-1 to D-3 having a fluted portion size of 4 mm×13 mm (diameter×length), hard substrates D-4 to D-6 having a fluted portion size of 8 mm×22 mm, and hard substrates D-7 and D-8 having a fluted portion size of 16 mm×45 mm.

Next, honing processes were applied to the cutting edges of the hard substrates (drills) D-1 to D-8, the hard substrates D-1 to D-8 were subjected to ultrasonic cleaning in acetone, were dried, and were accommodated in the arc ion plating apparatus shown in FIGS. 1A and 1B, and then the method of the present invention was carried out under the same conditions as in Example 4 by which a hard coating layer, which had component concentration profile in which the maximum Y component containing points having a designated composition shown in TABLE 21 and the points without Y component appear alternatingly and repeatedly at a designated interval also shown in TABLE 21 in the thickness direction, and the amount of contained Y component is continuously changed from the maximum Y component containing points to the points without Y component and from the points without Y component to the maximum Y component containing points, and which had a designated overall layer thickness also shown in TABLE 21, was formed by a vapor deposition method, and thereby surface-coated hard metal drills 1 to 8 of the present invention (hereinafter referred to as coated hard metal drills of the present invention) having a shape whose schematic front view is shown in FIG. 5A, and whose schematic transverse cross-sectional view, specifically at the fluted portion, is shown in FIG. 5B, as the coated cutting tools of the present invention, were fabricated.

For the purpose of comparison, honing processes were applied to the cutting edges of the hard substrates (drills) D-1 to D-8, the hard substrates D-1 to D-8 were subjected to ultrasonic cleaning in acetone, and then the hard substrates D-1 to D-8 were dried, and were accommodated in a conventional arc ion plating apparatus shown in FIG. 2. The conventional method was carried out under the same conditions as in the Example 4 by which a hard coating layer, which had a designated composition and a designated layer thickness shown in TABLE 22, and which included a (Ti, Y)N layer in which composition was substantially constant in the direction of the layer thickness, was formed by a vapor deposition method, and thereby conventional surface-coated hard metal end mills 1 to 8 (hereinafter referred to as conventional coated hard metal end mills), as conventional coated cutting tools, were fabricated.

Next, among the coated hard metal drills 1 to 10 of the present invention and the conventional coated hard metal drills 1 to 10, the coated hard metal drills 1, 2, 3, 9, and 10 of the present invention and the conventional coated hard metal drills 1, 2, 3, 9, and 10 were subjected to lubricated drilling tests with a large feed in which workpieces of tool steel were machined under the following conditions, workpiece: a plate of SKD61 (hardness: HRC53) defined in the JIS having a plane size of 100 mm×250 mm, and a thickness of 50 mm,
cutting speed: 20 m/min, and
feed: 0.3 mm/rev.

The coated hard metal drills 4 to 6 of the present invention and the conventional coated hard metal drills 4 to 6 were subjected to lubricated drilling tests with a large feed in which workpieces of ductile cast iron were machined under the following conditions,
workpiece: a plate of FCD450 defined in the JIS having a plane size of 100 mm×250 mm, and a thickness of 50 mm,
cutting speed: 35 m/min, and
feed: 0.6 mm/rev.

The coated hard metal drills 7 and 8 of the present invention and the conventional coated hard metal drills 7 and 8 were subjected to lubricated drilling tests with a large feed in which workpieces of cast iron were machined under the following conditions,
workpiece: a plate of FC300 defined in the JIS having a plane size of 100 mm×250 mm, and a thickness of 50 mm,
cutting speed: 65 m/min, and
feed: 0.9 mm/rev.

In each of the lubricated and high-speed drilling tests (in which a water-miscible cutting fluid was used), holes were formed until flank wear width of the cutting edge of the tip portion reached 0.3 mm, and the number of the holes was counted. The test results are shown in TABLES 21 and 22.

The compositions of the maximum Y component containing points and the points without Y component of the hard coating layers which were included in the coated cutting tools of the present invention, i.e., in the coated hard metal inserts 1 to 20 of the present invention, in the coated hard metal end mills 1 to 10 of the present invention, and in the coated hard metal drills 1 to 10 of the present invention, and the compositions of the hard coating layers which were included in the conventional coated cutting tools, i.e., in the conventional coated hard metal inserts 1 to 20, in the conventional coated hard metal end mills 1 to 10, and in the conventional coated hard metal drills 1 to 10, were measured using an Auger spectroscopic analyzer, and it was confirmed that the compositions were substantially the same as the designated compositions, respectively.

In addition, the distances between the maximum Y component containing points and the points without Y component, and the overall thicknesses of the hard coating layers of the coated cutting tools of the present invention, and the thicknesses of the hard coating layers of the conventional coated cutting tools were measured using a scanning electron microscope, and it was confirmed that the distances and thicknesses were substantially the same as the designated ones, respectively.

According to the results shown in TABLES 14 to 22, it is apparent that in the cases of the coated cutting tools of the

TABLE 21

| Classification | | Symbols of hard substrate | Maximum Y component containing points Designated composition (atomic ratio) | | | Points without Y component | Designated distance between two points (μm) | Designated overall layer thickness (μm) | Number of drilled holes |
|---|---|---|---|---|---|---|---|---|---|
| | | | Ti | Y | N | | | | |
| Coated | 1 | D-1 | 0.975 | 0.025 | 1.00 | TiN | 0.04 | 10 | 625 |
| hard metal | 2 | D-2 | 0.985 | 0.015 | 1.00 | TiN | 0.10 | 6.5 | 584 |
| drill of the | 3 | D-3 | 0.990 | 0.010 | 1.00 | TiN | 0.03 | 8 | 603 |
| present | 4 | D-4 | 0.965 | 0.035 | 1.00 | TiN | 0.06 | 5 | 1562 |
| invention | 5 | D-5 | 0.975 | 0.025 | 1.00 | TiN | 0.05 | 6 | 1515 |
| | 6 | D-6 | 0.995 | 0.005 | 1.00 | TiN | 0.01 | 7 | 1398 |
| | 7 | D-7 | 0.955 | 0.045 | 1.00 | TiN | 0.08 | 4 | 2167 |
| | 8 | D-8 | 0.980 | 0.020 | 1.00 | TiN | 0.02 | 5.5 | 2346 |
| | 9 | D-1 | 0.935 | 0.065 | 1.00 | TiN | 0.01 | 3 | 415 |
| | 10 | D-2 | 0.905 | 0.095 | 1.00 | TiN | 0.06 | 3 | 440 |

TABLE 22

| Classification | | Symbols of hard metal substrate | Designated composition (atomic ratio) | | | Designated layer thickness (μm) | Number of drilled holes |
|---|---|---|---|---|---|---|---|
| | | | Ti | Y | N | | |
| Conventional | 1 | D-1 | 0.975 | 0.025 | 1.00 | 10 | Tool Life Ended at 83 Holes |
| coated hard metal drill | 2 | D-2 | 0.985 | 0.015 | 1.00 | 6.5 | at 153 Holes |
| | 3 | D-3 | 0.990 | 0.010 | 1.00 | 8 | at 120 Holes |
| | 4 | D-4 | 0.965 | 0.035 | 1.00 | 5 | at 391 Holes |
| | 5 | D-5 | 0.975 | 0.025 | 1.00 | 6 | at 378 Holes |
| | 6 | D-6 | 0.995 | 0.005 | 1.00 | 7 | at 351 Holes |
| | 7 | D-7 | 0.955 | 0.045 | 1.00 | 4 | at 572 Holes |
| | 8 | D-8 | 0.980 | 0.020 | 1.00 | 5.5 | at 543 Holes |
| | 9 | D-1 | 0.935 | 0.065 | 1.00 | 3 | at 80 Holes |
| | 10 | D-2 | 0.905 | 0.095 | 1.00 | 3 | at 108 Holes |

(in the TABLE, tool life ended due to chipping)

present invention, which include the hard coating layer having a component concentration profile in which the maximum Y component containing points and the points without Y component appear alternatingly and repeatedly at a predetermined interval in a direction of thickness of the hard coating layer, and the amount of contained Y component is continuously changed from the maximum Y component containing points to the points without Y component and from the points without Y component to the maximum Y component containing points, the hard coating layers thereof exhibited a superior chipping resistance when these tools were used in cutting operations for various kinds of steels and cast irons under severe cutting conditions, such as with a large depth of cut or a large feed, in which large mechanical impacts occur, and in contrast, in the cases of the conventional coated cutting tools, in which the hard coating layer is of the (Ti, Y)N layer in which composition is substantially constant in the direction of the layer thickness, even though these tools exhibited superior high temperature hardness and wear resistance, these tools exhibited chipping due to insufficient strength and toughness, which led to relatively short tool life.

As explained above, because the coated cutting tools of the present invention exhibit a superior chipping resistance not only during cutting operations under normal conditions, but also, in particular, during cutting operations for various kinds of steels and cast irons under severe conditions, such as with a large depth of cut or a large feed, in which large mechanical impacts occur, and exhibit a superior wear resistance for a long term, the coated cutting tools of the present invention can sufficiently meet the demands of less power, less energy, and lower cost in cutting operations.

The invention claimed is:

1. A surface-coated cutting tool member comprising:
a hard substrate; and
a hard coating layer of a nitride compound containing titanium and yttrium, which is formed on a surface of the hard substrate using a physical vapor deposition method at an overall average thickness of 1 to 15 µm, wherein
the hard coating layer has a component concentration profile in which maximum Y component containing points, which conversely correspond to non-zero minimum titanium component containing points, and points without Y component (TiN points) appear alternately and repeatedly at a predetermined interval in a direction of thickness of the hard coating layer, and the amount of contained Y component is continuously changed from the maximum Y component containing points to the points without Y component and from the points without Y component to the maximum Y component containing points.

2. A surface-coated cutting tool member according to claim 1, wherein the maximum Y component containing points satisfy a composition formula of $(Ti_{1-X}Y_X)N$ (where X indicates an atomic ratio of 0.05 to 0.15), and a distance between one of the maximum Y component containing points and adjacent one of the points without Y component is from 0.01 to 0.1 µm.

3. A surface-coated cutting tool member according to claim 1, wherein the maximum Y component containing points satisfy a composition formula of $(Ti_{1-X}Y_X)N$ (where X indicates an atomic ratio of 0.005 to 0.10), and a distance between one of the maximum Y component containing points and adjacent one of the points without Y component is from 0.01 to 0.1 µm.

4. A surface-coated cutting tool member according to claim 3, wherein the maximum Y component containing points satisfy a composition formula of $(Ti_{1-X}Y_X)N$ (where X indicates an atomic ratio of 0.005 to 0.07).

5. A surface-coated cutting tool member according to claim 3, wherein the maximum Y component containing points satisfy a composition formula of $(Ti_{1-X}Y_X)N$ (where X indicates an atomic ratio of 0.01 to 0.05).

6. A surface-coated cutting tool member according to claim 1, wherein the hard substrate is a tungsten carbide based cemented carbide substrate.

7. A surface-coated cutting tool member according to claim 1, wherein the hard substrate is a titanium carbonitride based cermet substrate.

8. A surface-coated cutting tool member according to claim 1, wherein the hard substrate is a cubic boron nitride based sintered substrate.

9. A method for forming a hard coating layer on a surface of a cutting tool, the method comprising:
mounting the cutting tool of a hard substrate on a turntable housed in an arc ion plating apparatus at a position radially away from a center axis of the turntable in a manner rotatable about an axis of the cutting tool;
producing a nitrogen gas atmosphere as the reaction atmosphere in the arc ion plating apparatus; and
generating arc discharge between a cathode electrode of an Ti—Y alloy for forming maximum Y component containing points which conversely correspond to non-zero minimum titanium component containing points, and an anode electrode, and between another cathode electrode of metallic titanium for forming points without Y component (TiN points), which is disposed so as to oppose to the cathode electrode of an Ti—Y alloy with respect to the turntable, and another anode electrode, so that a hard coating layer having overall average thickness of 1 to 15 µm is formed, by a physical vapor deposition method, on the surface of the cutting tool being turned while rotating on the turntable about an axis of the cutting tool,
wherein the hard coating layer has a component concentration profile in which the maximum Y component containing points (the minimum titanium containing points) and the points without Y component (the TiN points) appear alternately and repeatedly at a predetermined interval in a direction of thickness of the hard coating layer, and the amount of contained Y component (titanium component) is continuously changed from the maximum Y component containing points to the points without Y component and from the points without Y component to the maximum Y component containing points.

10. A method for forming a hard coating layer on a surface of a cutting tool according to claim 9, wherein the maximum Y component containing points satisfy a composition formula of $(Ti_{1-X}Y_X)N$ (where X indicates an atomic ratio of 0.05 to 0.15), and a distance between one of the maximum Y component containing points and adjacent one of the points without Y component is from 0.01 to 0.1 µm.

11. A method for forming a hard coating layer on a surface of a cutting tool according to claim 9, wherein the maximum Y component containing points satisfy a composition formula of $(Ti_{1-X}Y_X)N$ (where X indicates an atomic ratio of 0.005 to 0.10), and a distance between one of the maximum Y component containing points and adjacent one of the points without Y component is from 0.01 to 0.1 µm.

12. A method for forming a hard coating layer on a surface of a cutting tool according to claim 9, wherein the maximum Y component containing points satisfy a composition formula of $(Ti_{1-x}Y_x)N$ (where X indicates an atomic ratio of 0.005 to 0.07), and a distance between one of the maximum Y component containing points and adjacent one of the points without Y component is from 0.01 to 0.1 μm.

13. A method for forming a hard coating layer on a surface of a cutting tool according to claim 9, wherein the maximum Y component containing points satisfy a composition formula of $(Ti_{1-x}Y_x)N$ (where X indicates an atomic ratio of 0.01 to 0.05), and a distance between one of the maximum Y component containing points and adjacent one of the points without Y component is from 0.01 to 0.1 μm.

14. A method for forming a hard coating layer on a surface of a cutting tool according to claim 9, wherein the hard substrate is a cemented carbide substrate containing tungsten carbide.

15. A method for forming a hard coating layer on a surface of a cutting tool according to claim 9, wherein the hard substrate is a cermet substrate containing titanium carbonitride.

16. A method for forming a hard coating layer on a surface of a cutting tool according to claim 9, wherein the hard substrate is a sintered substrate containing cubic boron nitride.

* * * * *

UNITED STATES PATENT AND TRADEMARK OFFICE
CERTIFICATE OF CORRECTION

| | | |
|---|---|---|
| PATENT NO. | : 7,144,639 B2 | Page 1 of 1 |
| APPLICATION NO. | : 10/503325 | |
| DATED | : December 5, 2006 | |
| INVENTOR(S) | : Eiji Nakamura et al. | |

It is certified that error appears in the above-identified patent and that said Letters Patent is hereby corrected as shown below:

In the Foreign Application Data Item [31]:

Please delete "Jan. 30, 2002 (JP) ……………….. 2002-023094" and substitute

-- Jan. 31, 2002 (JP) ……………….. 2002-023094 --.

Signed and Sealed this

Twentieth Day of February, 2007

JON W. DUDAS
*Director of the United States Patent and Trademark Office*